(12) United States Patent
Houston et al.

(10) Patent No.: US 8,331,187 B2
(45) Date of Patent: Dec. 11, 2012

(54) MEMORY WITH LOW POWER MODE FOR WRITE

(75) Inventors: Theodore W. Houston, Richardson, TX (US); Michael P Clinton, Allen, TX (US); Bryan D Sheffield, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/370,112

(22) Filed: Feb. 12, 2009

(65) Prior Publication Data
US 2009/0147603 A1 Jun. 11, 2009

Related U.S. Application Data

(62) Division of application No. 11/511,800, filed on Aug. 29, 2006, now Pat. No. 7,512,030.

(51) Int. Cl.
*G11C 5/14* (2006.01)
(52) U.S. Cl. .................. 365/226; 365/154; 365/156
(58) Field of Classification Search .................. 365/226
See application file for complete search history.

(56) References Cited

U.S. PATENT DOCUMENTS

| | | | |
|---|---|---|---|
| 2004/0243758 A1* | 12/2004 | Notani | 711/1 |
| 2005/0128790 A1 | 6/2005 | Houston | |
| 2006/0262628 A1* | 11/2006 | Nii et al. | 365/226 |

OTHER PUBLICATIONS

IEEE International Solid State Circuits Conference, ISSCC 2006/Session 34/SRAM/34/2, "A 4.2 GHz 0.3mm2 256kb Dual-Vcc SRAM Building Block in 65 nm CMOS", Muhammad Khellah et al., 2006, 2pgs.

* cited by examiner

*Primary Examiner* — Jason Lappas
(74) *Attorney, Agent, or Firm* — Rose Alyssa Keagy; Wade J. Brady, III; Frederick J. Telecky, Jr.

(57) ABSTRACT

The present invention describes circuitry and a method of providing a low power WRITE mode of operation for an integrated circuit comprising an SRAM memory to provide a reduced IDDQ relative to the IDDQ of a full active mode. In one aspect, the circuitry includes an SRAM memory array, mode control circuitry coupled to the array and configured to alter a supply voltage level to the SRAM array based on a mode of operation. The circuitry also includes control inputs coupled to the mode control circuitry for selecting one of the low power write mode, the full active mode, and optionally a retention mode of operation. The mode control circuitry is configured to receive the control inputs to select one of the three modes of operation, and to alter one or more supply voltage levels to the array, for example, the Vss supply voltage using a Vss supply circuit and the Vdd supply voltage using a Vdd supply circuit, based on the selected mode of operation. The mode control circuitry may also comprise a bitline precharge circuit configured to alter a bitline precharge voltage.

15 Claims, 17 Drawing Sheets

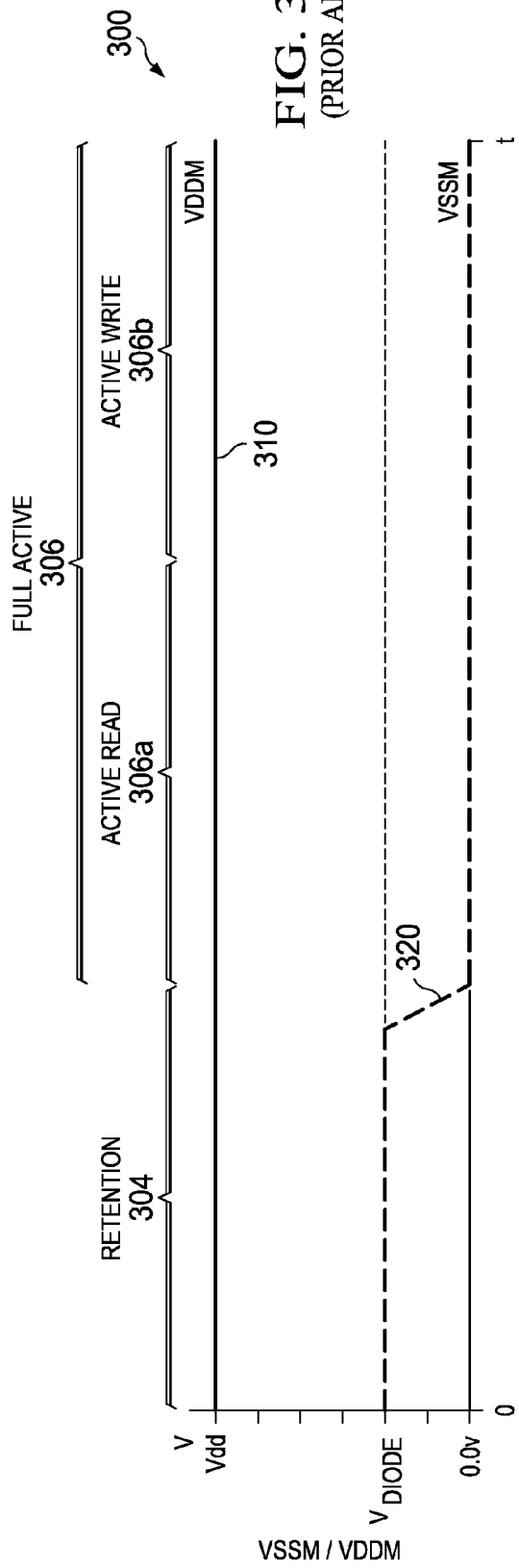
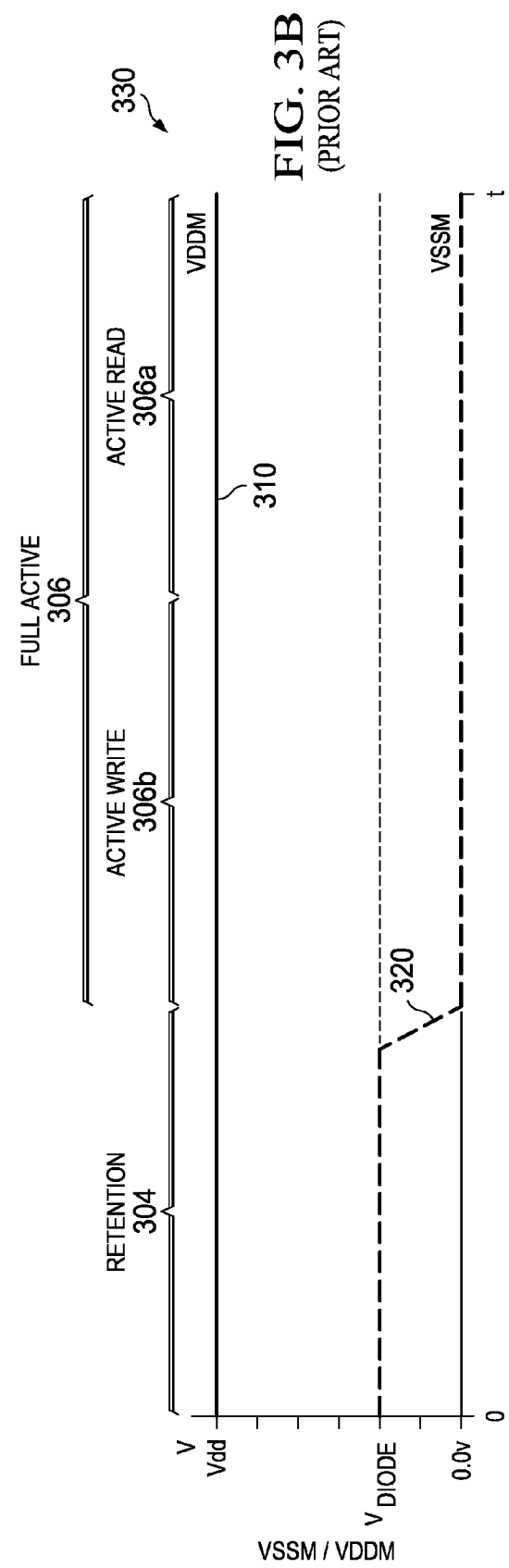

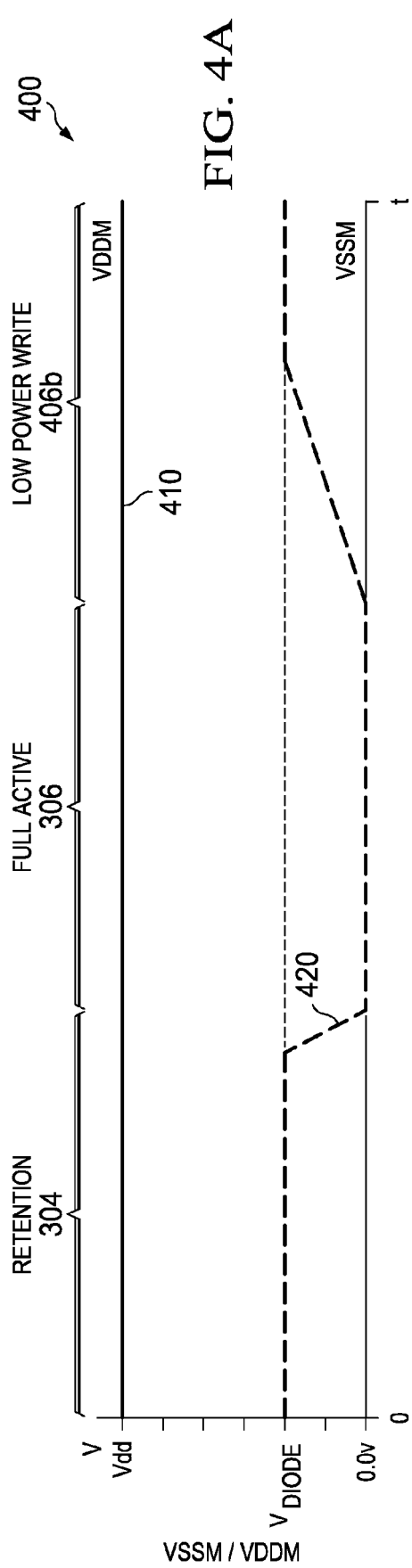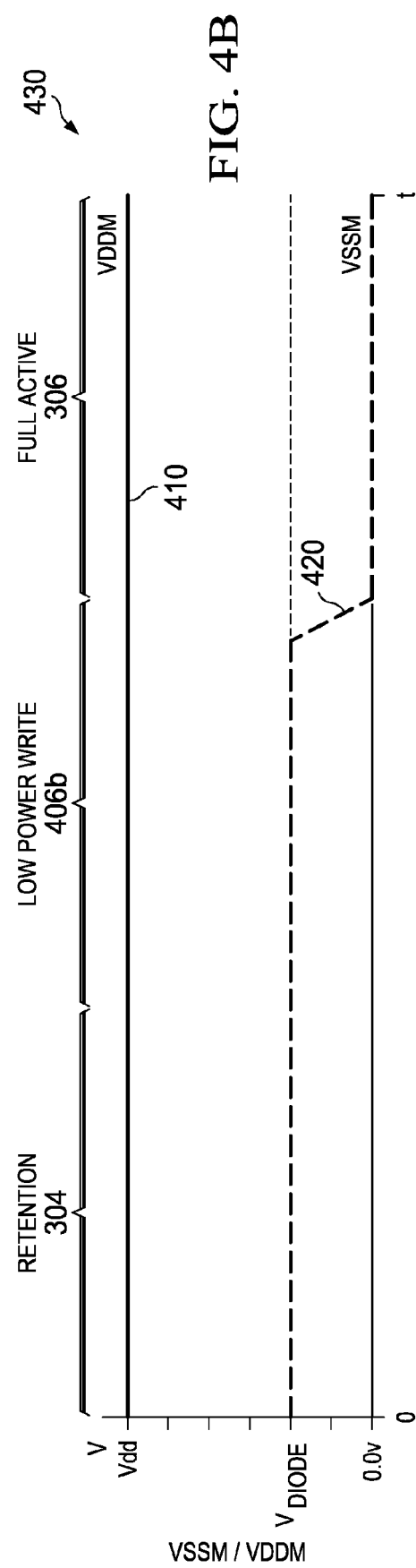

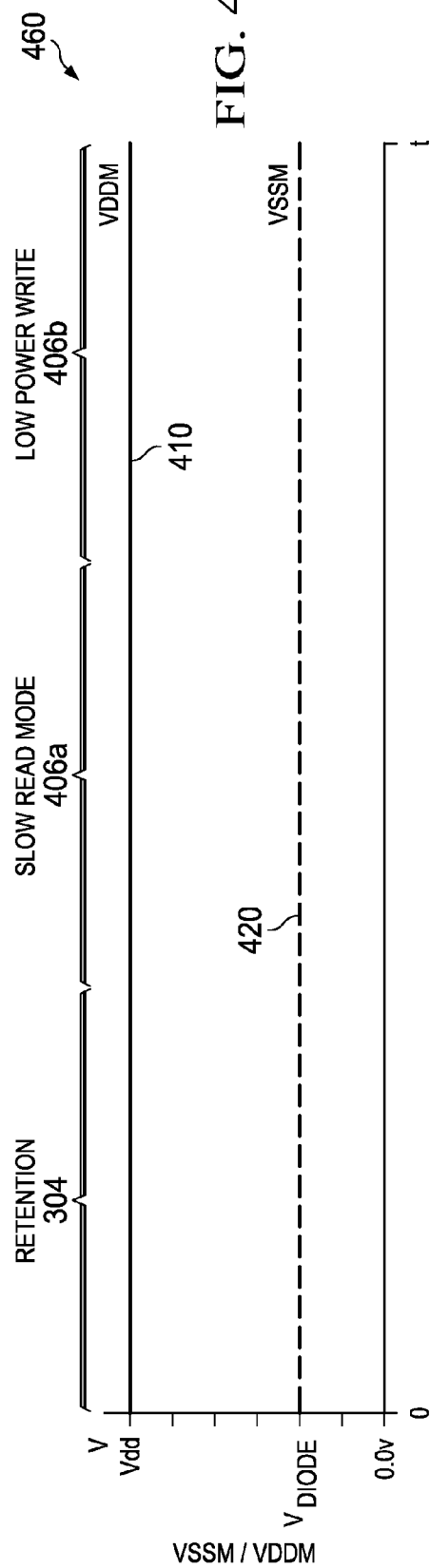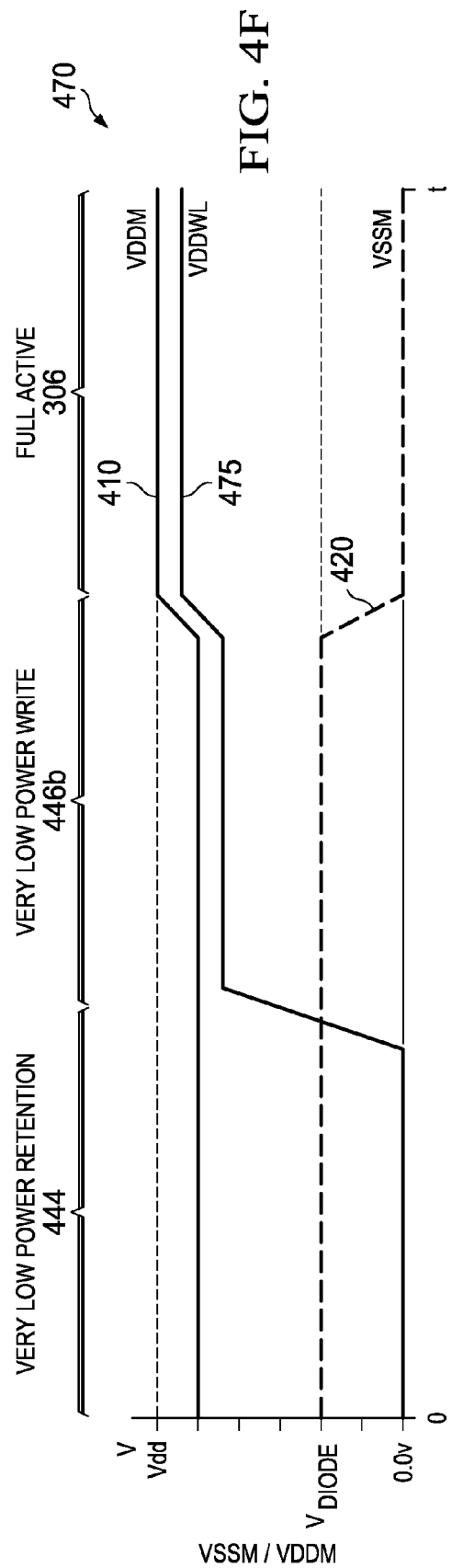

| MODE \ SIGNAL | | ACTIVE READ 606 | ACTIVE WRITE 608 | RETENTION (RET) MODE 610 | LOW POWER WRITE 612 | LOW POWER (SLOW) READ 614 |
|---|---|---|---|---|---|---|
| 227 | SRETB | Vdd | Vdd | 0.0v | 0.0v | 0.0v |
| 225 | VSSM | 0.0v | 0.0v | $V_{DIODE}$ | $V_{DIODE}$ | $V_{DIODE}$ |
| 255 | VDDM | Vdd | Vdd | Vdd | Vdd | Vdd |
| 132 | VWL | 0→VDD | 0→VDD | 0.0v | 0→VDD | 0→VDD |
| 130 | VBL | Vdd | Vdd OR <VSSM | FLOAT | Vdd | Vdd |
| 616 | OPERATIONS ENABLED | READ | WRITE | RET | WRITE | READ |
| 618 | IDDQ | IDDQ | IDDQ | VERY LOW IDDQ | LOW IDDQ | LOW IDDQ |

MODES vs. VOLTAGES AND OPERATIONS 602

FIG. 6A

| | MODE | 606 ACTIVE READ | 608 ACTIVE WRITE | 634 VERY LOW POWER RETENTION MODE | 636 VERY LOW POWER WRITE | 612 LOW POWER WRITE |
|---|---|---|---|---|---|---|
| | SIGNAL | | | | | |
| 227 | SRETB | Vdd | Vdd | 0.0v | 0.0v | 0.0v |
| 257 | DRET | 0.0v | 0.0v | Vdd | Vdd | 0.0v |
| 225 | VSSM | 0.0v | 0.0v | $V_{DIODE}$ | $V_{DIODE}$ | $V_{DIODE}$ |
| 255 | VDDM | Vdd | Vdd | $Vdd-V_{DIODE}$ | $Vdd-V_{DIODE}$ | Vdd |
| 132 | VWL | 0→VDD | 0→VDD | 0.0v | 0→VDD | 0→VDD |
| 130 | VBL | Vdd | Vdd OR <VSSM | FLOAT | Vdd | Vdd |
| 616 | OPERATIONS ENABLED | READ | WRITE | RET | WRITE | WRITE |
| 618 | IDDQ | IDDQ | IDDQ | VERY LOW IDDQ | VERY LOW IDDQ | LOW IDDQ |

MODES vs. VOLTAGES AND OPERATIONS 602

FIG. 6B

MEMORY WITH LOW POWER MODE FOR WRITE

This is a divisional application of Ser. No. 11/511,800 filed Aug. 29, 2006.

FIELD OF INVENTION

The present invention relates generally to semiconductor memory devices, and more particularly to an improved SRAM memory device comprising a WRITE mode having a reduced IDDQ relative to the IDDQ of a full active mode that reduces the leakage current, and minimizes latency and switching power overhead in embedded memory devices during write operations.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs), or non-volatile RAM and read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications including portable devices such as laptop computers and personal digital assistants (PDAs).

SRAM is typically arranged as a matrix of thousands of individual memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows and columns so that blocks of data such as words or bytes can be written or read simultaneously. Standard SRAM memory cells have many variations.

SRAM memory arrays come in all sizes from arrays having tens of cells, to arrays having billions of cells. SRAMs may also be provided as memory devices dedicated purely to memory storage operations, or as a memory array that is embedded within an integrated circuit (IC) which carries out one of a variety of other control and/or processing functions. Such embedded memory array applications may include, for example, an automotive engine controller or a communications IC, wherein the embedded SRAM memory array may store set-up parameters, coordinates, initial conditions, or other variables used by the IC. Accordingly, embedded SRAM memory array applications usually require smaller arrays than those dedicated purely to memory storage.

The basic CMOS SRAM cell generally includes two n-type or n-channel (nMOS) pull-down or drive transistors and two p-type (pMOS) pull-up or load transistors in a cross-coupled inverter configuration, which act as a bistable latch circuit, with two additional nMOS select or pass-gate transistors added to make up a six-transistor cell (a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

Each inverter of the SRAM memory cell includes a load transistor and a driver transistor. The output of the two inverters provide opposite states of the latch, except during transitions form one state to another. The pass-gate transistors provide access to the cross-coupled inverters during a read operation (READ) or write operation (WRITE). The gate inputs of the pass transistors are typically connected in common to a word line (wordline or WL). The drain of one pass transistor is connected to a bit line (bitline or BL), while the drain of the other pass transistor is connected to the logical complement of the bit line (bitline-bar or BLB).

A WRITE to a 6T cell is enabled by asserting a desired value on the BL and a complement of that value on BLB, and asserting the WL. Thus, the prior state of the cross-coupled inverters is overwritten with a current value. A READ is enabled by initially precharging both bitlines to a logical high state and then asserting the WL. In this case, the output of one of the inverters in the SRAM cell will pull one bitline lower than its precharged value. A sense amplifier detects the differential voltage on the bitlines to produce a logical "one" or "zero," depending on the internally stored state of the SRAM cell.

Accordingly, a consideration in the design of the embedded SRAM memory array is the leakage current of the cell transistors, which can be a significant contributor to the total power consumption of the device. The total leakage current of the device may be expressed as the supply current of the device (Idd) in the quiescent state or IDDQ. In a prior art, the memory can be put into a low power retention mode by reducing the voltage across the cell, but at minimum retention voltage, the cell can not be accessed for READ or WRITE operations in a normal manner. This is because the static noise margin (SNM), the trip voltage (Vtrip), and the read current (Iread) of the cell are all reduced. A reduced SNM can lead to cell upsets during READ or to unaccessed columns in an accessed row during WRITE. Therefore, there is overhead in latency and power when going into or out of the retention mode. As a result, such power consumption overhead and operational time delays are counterproductive to the goals of modern integrated circuits and embedded memory devices.

Accordingly, there is a need for an improved SRAM memory and method of operation that permits a low quiescent supply current while allowing some functionality, substantially maintains the static noise margin, trip voltage, and read current of the SRAM device, yet minimizes data upsets, latency, and switching power overhead in SRAM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to an integrated circuit having an SRAM memory array that utilizes a low power WRITE mode, mode control circuitry, and a method of implementing the same having a reduced IDDQ relative to the IDDQ of a full active mode (e.g., READ or WRITE mode). The circuits and methods effect a new "drowsy" or "low power WRITE" mode, which is enabled by altering one or more supply and/or bitline precharge voltages to provide the low power WRITE mode that may be intermediately biased between a "full active" mode that permits READ and WRITE operations, and a "retention" mode that allows neither READ or WRITE operations. Further, the difference between a drowsy write and the retention modes may be that power is maintained to the periphery circuitry in the drowsy write mode and the power turned off to the periphery in the retention mode, with the same bias to the array in both modes. In addition, a memory may have active and drowsy write modes and not a separate retention mode. The low power WRITE mode permits a WRITE operation while obtaining a lower IDDQ level than can be obtained in the full active mode, yet maintains a significant level of SNM, and Vtrip during the write operation.

In one aspect of the invention, the integrated circuit comprises an embedded SRAM memory array, a mode control circuitry coupled to the array and configured to alter a supply voltage level to the SRAM array based on a mode of operation, and read and write inputs coupled to the mode control circuitry for selecting one of a retention mode, the low power write mode, and the full active mode of operation. The mode control circuitry is also configured to receive the read and write inputs to select one of the retention mode, the low power WRITE mode, and the full active mode of operation based on the read and write inputs, and to alter a supply voltage level to the SRAM array based on the selected mode of operation. Alternatively, the logic circuitry may select the memory mode based on anticipated read and write activity, with the mode control circuitry configured to receive a mode select signal.

In another aspect of the invention, the mode control circuitry may comprise a Vss supply circuit coupled between an array Vss terminal and a Vss supply voltage. The Vss supply circuit is configured to raise a Vss-array voltage at the array Vss terminal above the Vss supply voltage level. The mode control circuitry is configured to perform this voltage alteration in the retention mode and in the low power WRITE mode.

In still another aspect of the invention, the mode control circuitry may comprise a Vdd supply circuit coupled between an array Vdd terminal and a Vdd supply voltage. The Vdd supply circuit is configured to reduce a Vdd-array voltage at the array Vdd terminal below the Vdd supply voltage level. The mode control circuitry is configured to perform this voltage alteration in the retention mode and in the low power WRITE mode.

In yet another aspect of the invention, the mode control circuitry comprises a bitline (BL) precharge circuit coupled to one or more bitlines of the array, the bitline precharge circuit is configured to reduce a bitline precharge voltage below a Vdd supply voltage level. In one example, the bitline precharge voltage is reduced below a Vdd supply voltage level by about the threshold voltage of a pass transistor of an SRAM cell of the SRAM array, or about Vdd-Vtn (passgate). The bitline precharge voltage level may be lower for the drowsy write mode than for the full active mode.

In another aspect of the invention, the mode control circuitry comprises a mode controller coupled to the array by way of the Vss supply circuit, the Vdd supply circuit, and the bitline precharge circuit. In one embodiment of the invention, the mode controller is operable to alter the Vss-array voltage via the Vss supply circuit, to alter the Vdd-array voltage via the Vdd supply circuit, and to alter the BL precharge voltage via the BL precharge circuit for the array based on the mode of operation selected by the read and write inputs.

In yet another aspect, the supply voltage and bitline precharge voltages may be altered using a voltage drop element connected between the SRAM array and the supply voltage. In one embodiment, the voltage drop element is a transistor connected as a diode.

The SRAM memory structure of the present invention permits a low quiescent supply current during the low power WRITE mode, while allowing a write operation, while substantially maintaining the static noise margin, trip voltage, and read current of the SRAM device, yet minimizes data upsets, latency, and switching power overhead in SRAM memory devices. The structures described herein are applicable to silicon wafer fabrication and other such fabrication processes in the manufacture of semiconductor memory devices such as may be used in integrated circuits utilizing embedded memory devices.

The present invention also provides a method of reading and writing data in an embedded SRAM memory array. In one embodiment, the method comprises receiving control signal inputs (e.g., a read signal input, a write signal input, and a mode selection signal), selecting one of a retention mode, a low power WRITE mode, and a full active mode of operation based on the control signal inputs, and altering one or more supply voltage levels to the SRAM array based on the selected mode of operation.

In an alternative embodiment, the method comprises receiving a mode selection signal input, selecting one of a retention mode, a low power WRITE mode, and a full active mode of operation based on the anticipated read and write activity, and altering one or more supply voltage levels to the SRAM array based on the selected mode of operation.

In another aspect of the invention, the method further comprises altering a bitline precharge voltage coupled to one or more bitlines of the array. In one embodiment, the altering of the bitline precharge voltage comprises reducing the bitline precharge voltage below a Vdd supply voltage level. In another embodiment, the altering of the bitline precharge voltage comprises reducing the bitline precharge voltage in the drowsy write mode relative to the precharge voltage in the full active mode.

In still another aspect the method of altering of the one or more supply voltage levels to the SRAM array comprises raising a Vss-array voltage of the array above a Vss supply voltage level.

In yet another aspect, the method of altering of the one or more supply voltage levels to the SRAM array comprises reducing a Vdd-array voltage of the array below a Vdd supply voltage level.

In another aspect, the method of altering of the one or more supply voltage levels to the SRAM array comprises raising a Vss-array voltage of the array above a Vss supply voltage level in the retention mode and in the low power WRITE mode; reducing a Vdd-array voltage of the array below a Vdd supply voltage level in the retention mode and in the low power WRITE mode; and providing the Vss supply voltage to an array Vss terminal, the Vdd supply voltage to an array Vdd terminal, and the Vdd supply voltage to the bitline precharge voltage for the one or more bitlines of the array in the full active mode.

In another aspect, the method of altering of the one or more supply voltage levels to the SRAM array comprises raising a Vss-array voltage of the array above a Vss supply voltage level in the retention mode and in the low power WRITE mode; reducing a Vdd-array voltage of the array below a Vdd supply voltage level in the retention mode; and providing the Vss supply voltage to an array Vss terminal, the Vdd supply voltage to an array Vdd terminal, and the Vdd supply voltage to the bitline precharge voltage for the one or more bitlines of the array in the full active mode.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 3A and 3B are simplified timing diagrams of the two conventional modes of operation, the modes including the retention mode, and the active read and write modes of operations;

FIGS. 4A and 4B are simplified timing diagrams of several modes of operation that may be selected by the mode control circuitry of FIG. 1D using the read and write inputs, the modes illustrated including the retention mode, an active read mode, and a low power write mode of operation according to one or more aspects of the present invention;

FIGS. 4E and 4F are simplified timing diagrams of further modes of operation that may be selected by the mode control circuitry of FIG. 1D using the read and write inputs, the modes illustrated including the retention mode, the very low power retention mode, the active read mode, the low power write mode, a very low power write mode, and a slow READ mode of operation according to one or more aspects of the present invention;

FIGS. 6A and 6B are charts of the modes, exemplary voltages, operations enabled for the three or more modes of operation that may be selected by the mode control circuitry of FIG. 1D in accordance with the principles of the present invention.

DETAILED DESCRIPTION OF THE INVENTION

Figure 1A:
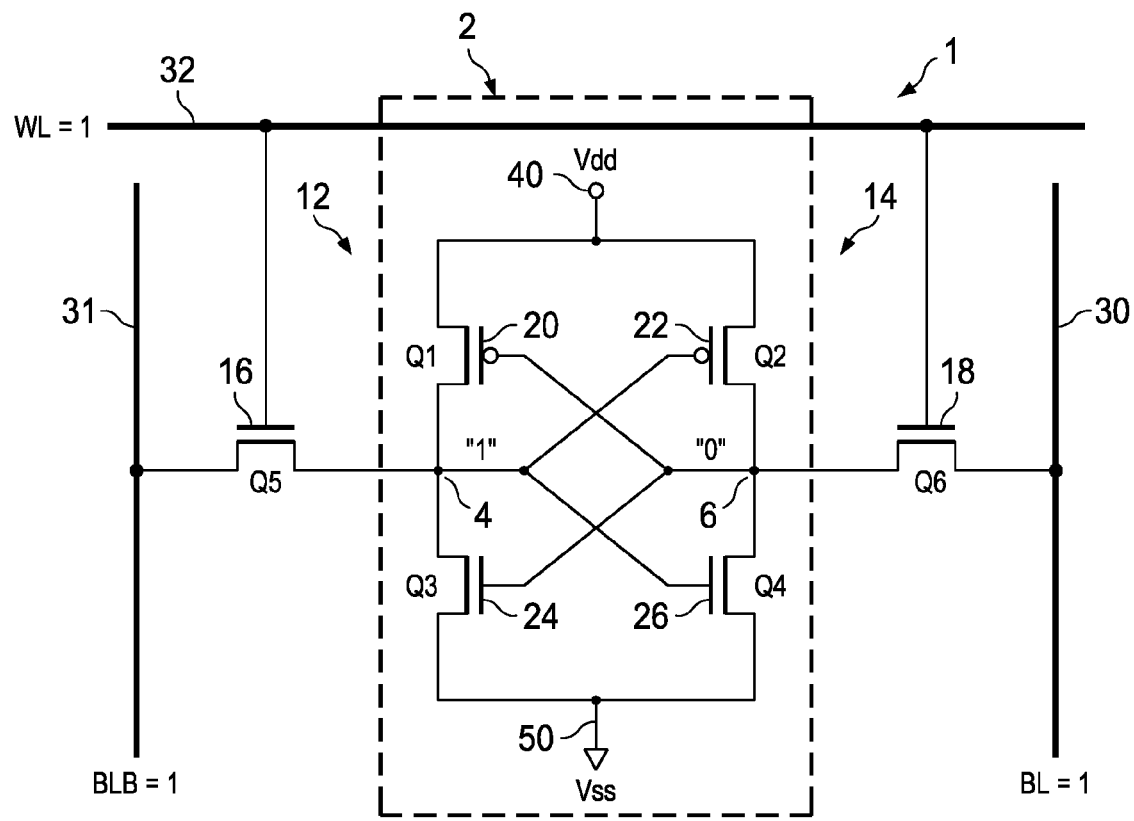
FIG. 1A is a schematic diagram of a conventional 6T static random access memory (SRAM) cell and SRAM core cell having a pair of output data nodes.

The present invention will now be described with reference to the attached drawings, wherein like reference numerals are used to refer to like elements throughout. The invention provides a memory array (e.g., an SRAM memory array), and/or a memory array embedded within an integrated circuit (IC), wherein the memory utilizes a new "low power WRITE" mode, mode control circuitry, and a method of implementing the same having a reduced IDDQ relative to the IDDQ of a full active mode (e.g., READ or WRITE mode). The new "low power WRITE" mode or "drowsy" mode is implemented by the mode control circuitry, which alters one or more supply and/or bitline precharge voltages of the memory array. These voltage alterations enable the low power WRITE mode, in one embodiment, to be intermediately biased between a "full active" mode, which permits READ and WRITE operations, and a "retention" mode that allows neither READ or WRITE operations. The low power WRITE mode permits a WRITE operation while obtaining a lower IDDQ level than can be obtained in the full active mode, yet maintains a significant level of SNM, and Vtrip during the write operation. Optionally, the retention mode need not be used, and/or the bias to the array may be the same for the drowsy write as for the retention modes, whether or not the periphery is powered down in the retention mode. Typically, the memory peripheral circuits may be powered off, or supplied a reduced power level in the retention mode compared to the power in the periphery during the drowsy write or active modes.

The mode control circuitry is configured, for example, to provide a raised Vss voltage, and/or a reduced Vdd voltage, and/or a reduced bitline precharge voltage (e.g., relative to Vdd), and/or a reduced word line (WL) voltage, or a combination of such voltage alterations in response to the selected mode of operation. In addition, the mode control circuitry is configured to permit initiation of a READ operation from the low power WRITE mode by concurrently reducing the Vss of the array (VSSM) to Vss. Thus, the memory system and method of the present invention may provide three operational modes to switch among for optimum performance and power savings:

1) a full active mode having a low array Vss with both READ and WRITE operations enabled;

2) a low power WRITE or drowsy mode for reduced power having a raised Vss with WRITE enabled; and 3) a retention mode having both READ and WRITE operations disabled to save power.

Optionally, the retention mode may have a raised array VSS

Further, other optional modes may also be added by combining these voltage bias conditions, including:

4) a low power (slow) READ mode may also be provided using the raised array Vss of the low power WRITE mode;

5) a very low power retention mode may be provided by combining the raised array vss and a reduced array Vdd to save additional power; and 6) a very low power WRITE mode having a raised array Vss and a reduced array Vdd may also be optionally provided.

Optionally, the power to the peripheral circuits may be different among the modes and/or the voltages supplied to the array may be different among the modes. For example, the voltages to the array may be the same in the retention and low power write modes with reduced power to the periphery in the retention mode relative to the power to the periphery in the low power write mode.

Accordingly, the mode control circuitry permits the IDDQ to be reduced and memory retained by lowering the total supply voltage across the cell. If the voltage across the cell is reduced by raising the array Vss relative to the substrate rather than by simply lowering the array Vdd, there will be a back bias to the n-channel transistors of an SRAM, for example. This bias condition raises the threshold voltage of the transistors, which improves the static noise margin (SNM) of the cell, reducing the probability of data upsets. SNM is further improved if the bitline BL precharge is lowered somewhat from the array drain supply voltage Vdd, for example, by about the threshold voltage of a pass gate transistor of the core cell, (Vdd-Vtn). However, BL precharge should not be lowered more than about Vtn below array Vdd, or SNM will drop sharply. In addition, with the array-Vss voltage raised, if the BL is pulled down below array-Vss toward substrate voltage (e.g., ground), there will be a stronger WRITE. The reduction in array IDDQ in the low power write mode may not be as great as if the voltage is reduced to the minimum required for retention without access, but the reduction can still be significant, and the need to come out of this reduced IDDQ mode to do a WRITE is thereby eliminated.

A READ may also be accomplished with the same bias conditions as described above, but the read current will be greatly reduced, resulting in a slow read. One option to reduce the latency that may be incurred in switching from the low power drowsy write mode to the active mode for a READ that is initiated when the array is in this low power WRITE mode, is to start access for the Read prior to the array VSS being lowered to the value for the full active mode. For example, the WL is allowed to go high for a READ that follows a drowsy write mode while the array Vss is being pulled down.

The memory including the circuitry discussed above may be optionally configured to support the WRITE in this low IDDQ mode in conjunction with support of other modes such as a minimum retention voltage with no access and periphery shut-off.

The distinction in the array bias condition for this drowsy or low power WRITE mode and a lower IDDQ mode without access is driven by the SNM of cells in a row accessed for WRITE but in unaddressed columns. While raising the array Vss does not initially degrade SNM, and may even improve SNM, as the array Vss voltage is increasingly raised, the SNM will eventually degrade. If the voltage across the cell is reduced to the minimum voltage across the cell for data retention in unaccessed cells, the unaddressed cells in the accessed row for a write may be subject to upset. Thus, for an architecture in which all cells in an addressed row are written into, there would not need to be a distinction between the array bias conditions for drowsy WRITE and for minimum IDDQ during unaccessed standby. The distinction for the present invention would be having the WRITE periphery powered and WRITE enabled while the array is at the low IDDQ bias.

Another option, in accordance with the present invention, is to reduce the WL high state voltage in the low power WRITE mode. With the array-Vss (VSSM) raised and the bitline being pulled lower than VSSM for WRITE, the WRITE is very robust, such that there is some margin for lowering the WL high state voltage. This bias condition would improve the SNM of the unaddressed cells in the accessed row for the low power WRITE. This option will be shown and discussed further in association with waveform 475 of FIG. 4F hereafter.

Thus, to minimize the latency and switching power overhead, a memory device is needed that has a reduced IDDQ mode, yet still allows some functionality, for example, a WRITE or READ operation functionality.

Prior art includes methods that raise the array Vss for IDDQ reduction, but do not support a WRITE when in this mode. Another prior art includes general operation with a slightly raised array Vss, but does not support lowering of the array Vss for the full active mode with READ and WRITE, and the enablement of WRITE with raised array Vss.

There are essentially two types of retention mode.

Type 1: The Periphery logic, for example, address decode, WL drivers, or write drivers, is powered off.

Type 2: Power is maintained to the periphery, or optionally at a reduced level.

In both types 1 and 2, the voltage across the cell is reduced relative to an active mode, to reduce IDDQ. This may be accomplished by lowering the array VDD or by raising the array VSS, or both.

The latency in going from the retention mode to the active mode will be greater for type 1 retention modes than for type 2. In some cases, the latency in going from type 2 retention modes to the active mode can be hidden within an active cycle.

Dynamic switching power is consumed in the control logic in switching between each of the modes. Thus, it is desirable to reduce the frequency of switching between modes. Also, IDDQ is increased in the active mode, so it is desirable to stay in a retention mode as much as possible. Performing a WRITE in a retention mode (or drowsy write) as well as in the active mode reduces the frequency of mode switching and also allows more time in a retention mode with reduced IDDQ.

Because of switching power, latency, and circuit overhead (complexity, power, and area), in one embodiment of the present invention, it may be desirable to have the drowsy write mode (retention mode with enough voltage across the cell to allow WRITE without upset of unaddressed cells in a selected row) be the only reduced voltage mode. In another exemplary embodiment, both type 1 and 2 retention modes could have the WRITE enabled in the type 2 retention mode. A third possibility is to have a type 2 retention mode and a separate drowsy write mode in which the voltage across the cell is less in the retention mode than in the drowsy write mode.

Generally, it is preferable to raise array VSS vs lowering array VDD for drowsy write, since raising array VSS increases Vtn due to body effect, and increased Vtn improves SNM. For a type 2 retention mode with less voltage across the cell than in drowsy write mode, one approach is to have two different levels of raised VSS. Another option is to raise VSS to the same level for both drowsy write and retention, and to lower Vdd for retention relative to the drowsy write.

Exemplary implementations are hereinafter illustrated and described in the context of fabricating SRAM memory structures to permit a low power WRITE mode that reduces the IDDQ of the device, provides more flexibility in optimizing the trade-off of reduced IDDQ vs latency and switching power, significantly maintains the SNM and the Vtrip of a conventional 6T SRAM memory, for example, and avoids write data upsets, wherein the structures illustrated are not necessarily drawn to scale. The present invention may also provide a lower total power, taking into account dynamic power, than that of a low power mode without WRITE enabled, even if the low power mode without WRITE has a lower IDDQ than the low IDDQ with the WRITE mode. Further, by allowing a READ to start in the drowsy mode while lowering the array Vss, the latency in going from the drowsy mode to the full active mode is reduced.

It will be appreciated that the invention may be employed in the fabrication of SRAM memory devices, silicon wafer fabrication and other such fabrication processes in the manufacture of semiconductor memory devices, and other such processes apart from the exemplary memory structures and methods described and illustrated herein. These and other benefits will become more apparent as the following figures are described infra.

Figure 1B:
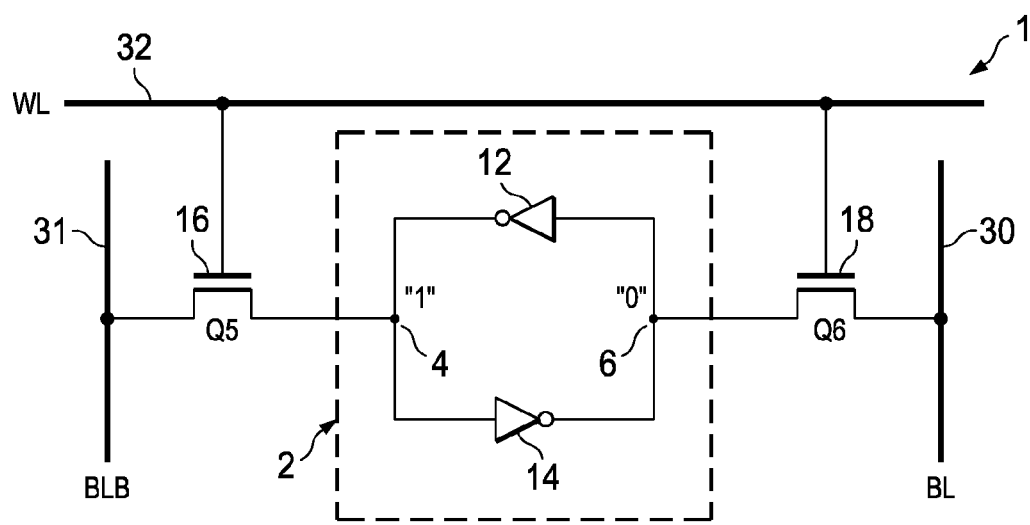
FIG. 1B is a simplified schematic diagram of the conventional 6T static random access memory (SRAM) cell of FIG. 1A, with the core cell represented as a pair of cross-coupled inverters connected to the output data nodes.

Beginning at FIGS. 1A and 1B a conventional 6T SRAM cell 1 is illustrated and several problems arising from read and write operations are presented.

FIG. 1A, for example, illustrates a schematic diagram for the conventional differential 6T static random access memory (SRAM) cell 1. SRAM cell 1 comprises a data storage cell, latch, or core cell 2, generally including a pair of cross-coupled inverters, for example, inverter 12, and inverter 14, the latch 2 operable to store a data bit state. As illustrated in FIG. 1A, the bit is stored in the latch 2 at the data nodes or first and second latch nodes 4 and 6, respectively, having a high or "1" state and a low or "0" state, respectively. Cell 1 also comprises a pair of wordline pass transistors 16, 18 to read and write the data bit between the cross-coupled inverters 12, 14 and bitlines BL 30, BL-bar 31, when enabled by wordline 32.

Respective inverters 12, 14 comprise a p-type MOS (PMOS) pull-up or load transistor Q1 20, Q2 22 and an n-type (nMOS) pull-down transistor Q3 24, Q4 26. Pass transistors Q5 16, Q6 18 are n-channel as well, which generally supply higher conductance than p-channel transistors. Pass transistors 16, 18 are enabled by wordline 32 and accessed by bitlines 30, 31 to set or reset the SRAM latch 1. FIG. 1A further illustrates that inverters 12, 14 of the SRAM memory cell 1 are connected together to a Vdd drain voltage line 40 and a Vss source voltage line 50.

The differential 6T SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective PMOS (20, 22) and nMOS (24, 26) transistors are load balanced and matched for the two inverters (12, 14). However, as dimensions are reduced to scale down devices, random variation increases and it becomes increasingly difficult to achieve a balance in the relative strengths of the pass gate, drive, and load transistors over the desired range of temperature, bias conditions, and process variations in the presence of the range of random variation that occurs over the large number of cells in an array. As a result, SRAM cells formed as such can be adversely affected by varying operating characteristics, may be unstable, and may not retain the desired bit state during read or write operations (data upset), or data may not be reliably written into the cells, or there may be insufficient read current.

In addition, because of these reduced dimensions and the random variations, the leakage current in an embedded memory can be a significant portion of the total power consumption of the device. The low power WRITE mode of the present invention allows further optimization opportunities for saving power while providing for WRITE operation functionality.

During the read operation, for example, bitlines 30 and 31 are precharged to a high or "1" state, as shown in FIG. 1A. Wordline WL 32 is selected to activate pass transistors Q5 16 and Q6 18 into conduction. As a high state at latch node 4 is on the gate of Q4 26, and a low state at latch node 6 is on the gate of Q3 24, only Q4 26 on the "low side" conducts a read current. Read current conducts from the bitline-bar 31 through Q6 18, latch node 6, and Q4 26 to Vss 50. The read current through Q6 and Q4 briefly creates a voltage drop across Q4 26, until the voltage on bitline-bar 31 is discharged to Vss 50 (e.g., ground). If sufficient voltage drop is created by the read current to raise latch node 6 to the threshold voltage Vt of Q3 24, then Q3 may begin conducting and the data state of latch 2 may be upset.

The static noise margin SNM reflects the statistical data loss due to read upsets. For example, if SNM is too low, some bits of an array of cells will start to fail in a Gaussian distribution. Thus during a read operation, the greater the voltage drop across the pull-down transistor relative to the threshold voltage of the pull down transistor, the smaller will be the remaining static noise margin SNM within the available threshold voltage Vtn. Therefore, it is desirable to lower the voltage drop, or better still to avoid its affect on the latch nodes 4 and 6 in order to maximize the SNM and optimize the switching characteristics of the latch 2. Raising Vtn of the driver will improve the SNM, but will reduce the read current.

FIG. 1B illustrates the conventional 6T static random access memory (SRAM) cell 1 of FIG. 1A, with the data storage cell, latch, or core cell 2 represented as a pair of cross-coupled inverters 12 and 14 having the output data nodes 4 and 6, respectively.

Figure 1C:
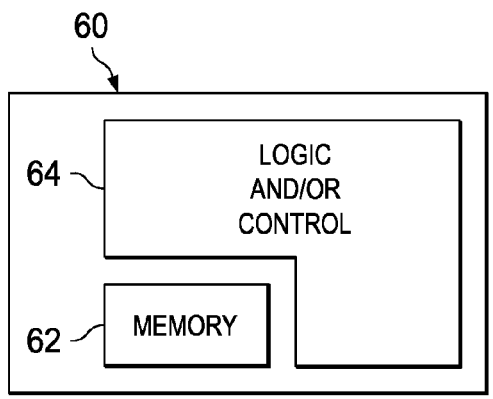
FIG. 1C is a simplified layout diagram of a conventional integrated circuit having an embedded memory region, comprising an array of cells such as the static random access memory (SRAM) cell of FIG. 1A, and having a logic and/or control region, such as may be used in accordance with one or more aspects of the present invention.

FIG. 1C illustrates an integrated circuit 60 having an exemplary memory region 62 such as may be used in accordance with the present invention, comprising an array of memory cells such as the static random access memory (SRAM) cell of FIG. 1A. The integrated circuit 60 further includes a logic and/or control region 64, for processing, logic, or a variety of other such functions in numerous applications wherein the memory (e.g., an embedded memory array) may be utilized.

Figure 1D:
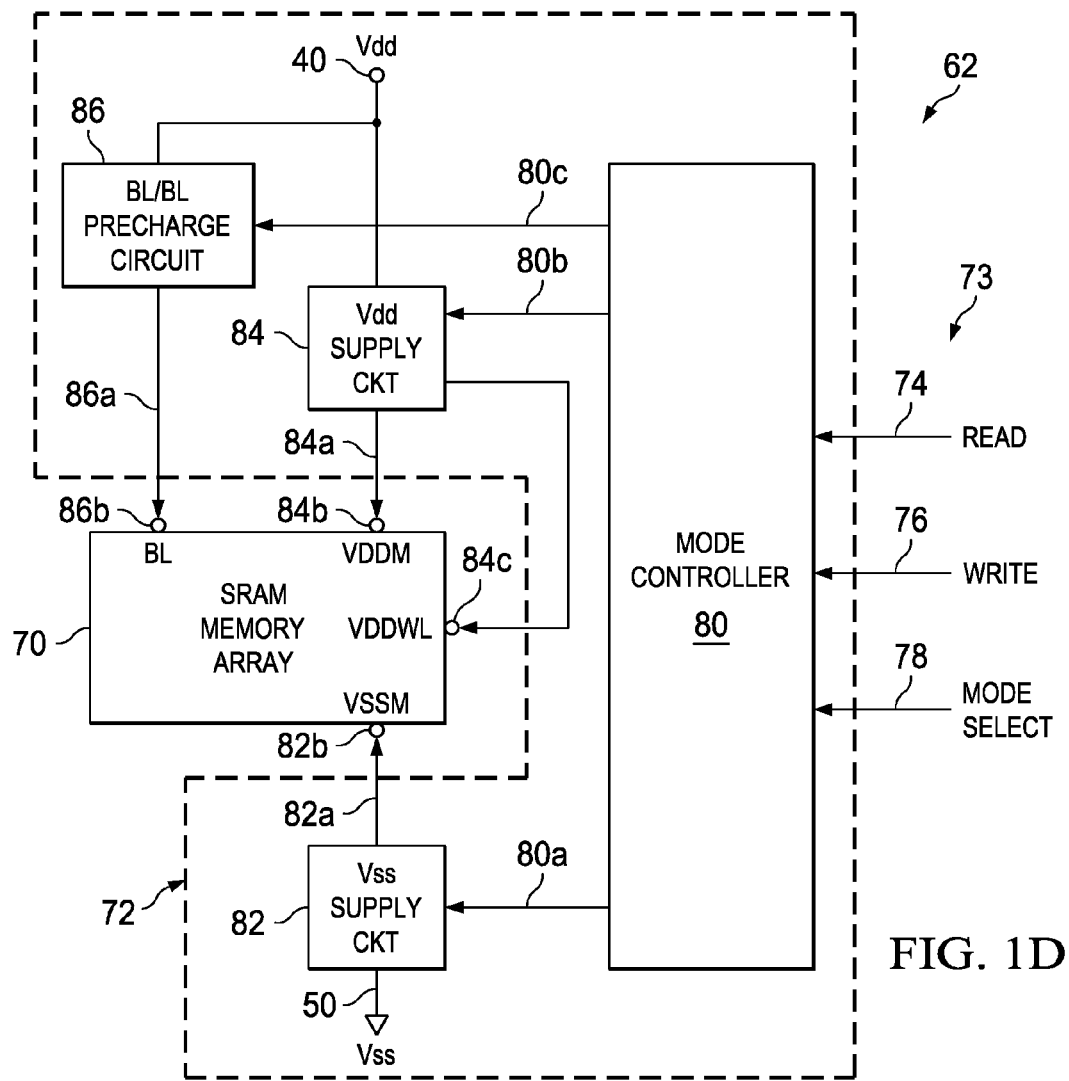
FIG. 1D is a functional block diagram of an exemplary memory of FIG. 1C, the memory comprising an SRAM memory array for data storage, mode control circuitry for selecting one of three read and write operating modes, including a new low power write mode, and further comprising read and write inputs used to select one of the three read and write operating modes according to one or more aspects of the present invention.

FIG. 1D illustrates further details of the memory 62 of FIG. 1C, in accordance with one or more aspects of the present invention. The memory 62, for example, comprises an SRAM memory array 70 for data storage, mode control circuitry 72 for selecting one of the three basic operating modes (e.g., modes 1, 2, and 3 described above), including, the retention mode, the new low power write mode, and the full active mode. In addition, the exemplary memory circuit 62 is further operable to provide the three other optional modes described above as modes 4, 5, and 6. Memory 62 further comprises control inputs 73, comprising read and write inputs 74 and 76, respectively, to select one of the three read and write operating modes, and a mode select signal input 78 to allow the logic to select one of the modes above in anticipation of READ, WRITE, or idle cycles.

The mode control circuitry 72, further comprises a mode controller 80, for example, that receives the control inputs 73, and selects one of the three or more modes (e.g., 3 to 6 modes), based on the specific combination of the inputs 74, 76, and 78, and optionally on a preset within the mode controller 80, for example. For example, the three basic operational modes may be selected by the control inputs 73, while the optional modes 4, 5, and 6 discussed above, may be selected using a preset within the mode controller 80, or by the mode selection input 78. In response, the mode controller 80 alters one or more supply voltages and/or bitline or bitline precharge voltages to the array 70, which establishes one of the desired modes of operation.

For example, mode controller 80 is configured to alter the source (supply) voltage Vss 50, utilizing a Vss supply circuit 82 to provide an array-Vss voltage (VSSM) 82a at an array-Vss terminal 82b of the memory array 70. Mode controller 80 is also configured to alter the drain (supply) voltage Vdd 40, utilizing a Vdd supply circuit 84 to provide an array-Vdd voltage (VDDM) 84a at an array-Vdd terminal 84b of the memory array 70. A WL 32 driver supply voltage VDDWL 84c input from the Vdd supply circuit 84 supports the option of lowering the WL VDD supply during the drowsy write mode. Mode controller 80 is further configured to alter a bitline or bitline precharge voltage Vbl 86a to the array 70 (e.g., derived from the drain (supply) voltage Vdd 83), utilizing a bitline/bitline precharge circuit 86 connected to a bitline terminal 84b of the memory array 70.

In one embodiment, using this mode control circuitry 72, the control inputs 73, select one of the three retention, low power WRITE, and full active modes. The mode selection is then used to control one or more of the Vss 82 and Vdd 84 supply circuits, the wordline driver supply VDDWL 84c, or the BL/BL precharge circuit 86 to alter the corresponding voltage to the memory array 70 based on the mode selection, for example, as will be shown and discussed further in association with the mode, voltage, and operations chart of FIGS. 6A and 6B.

Figure 1E:
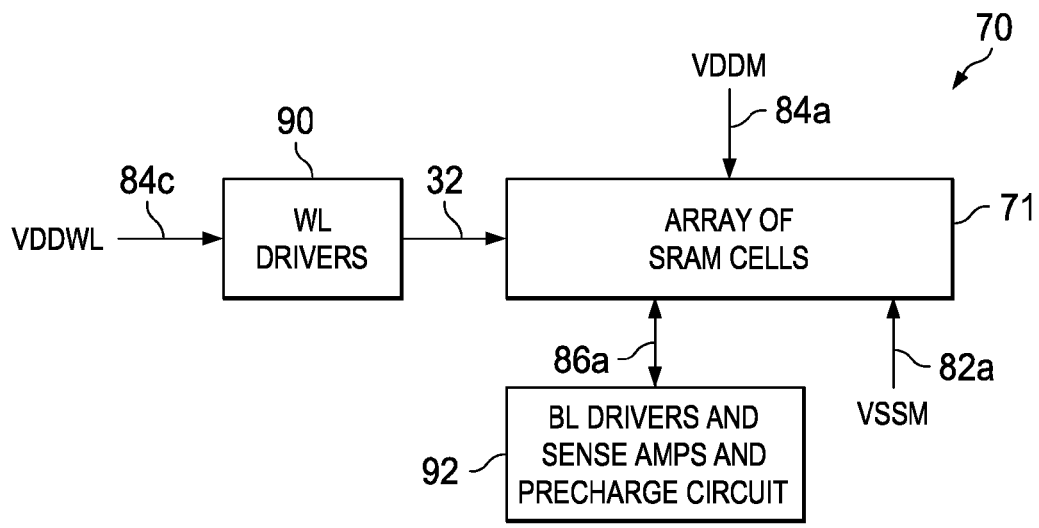
FIG. 1E is a functional block diagram of the SRAM memory array of FIG. 1D, the memory comprising an array of SRAM memory cells for data storage, wordline drivers for selecting rows of memory cells of the array, and bitline drivers for selecting columns of cells of the array, and sense amplifiers for detecting the state of the cells, and also including VSSM and VDDM supply inputs for powering the array according to one or more aspects of the present invention.

Turning to FIG. 1E, the SRAM memory array 70 of FIG. 1D is illustrated, the memory 70 comprising an array of SRAM memory cells 71 for data storage, wordline drivers 90 for selecting rows of memory cells of the array 70, and bitline drivers, sense amplifiers, and precharge circuit 92 for selecting columns of cells of the array and for detecting the state of the cells 71. Memory 70 also includes VSSM supply input 82a and VDDM supply input 84a, for powering the array 71 according to one or more aspects of the present invention.

Figure 1F:
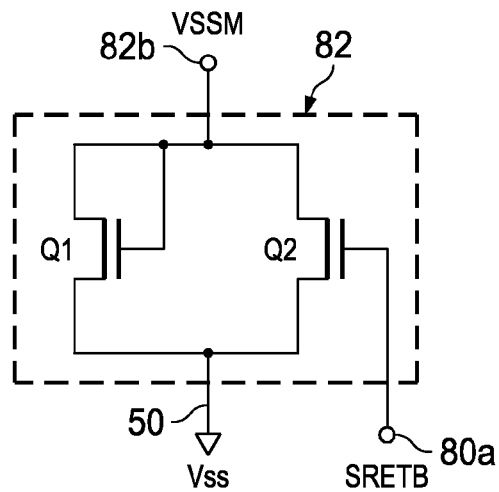
FIGS. 1F and 1G are schematic diagrams of exemplary NMOS and PMOS Vss supply circuits, respectively, such as may be used in accordance with the memory array of FIGS. 1D and 1E.
Figure 1G:
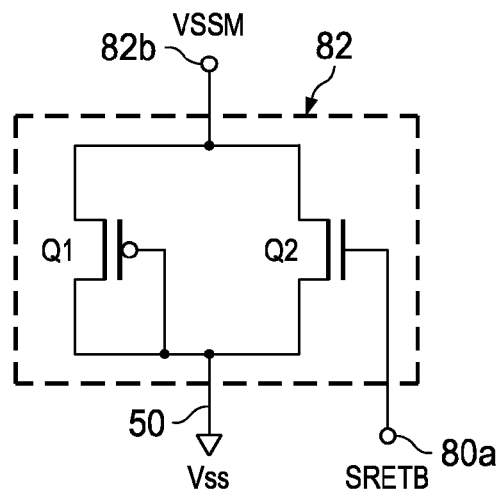

FIGS. 1F and 1G illustrate exemplary NMOS and PMOS Vss supply circuits embodiments, respectively, such as may be used in accordance with the memory array of FIGS. 1D and 1E to alter the array supply voltages to the array. For example, Q1 represents a transistor (NMOS or PMOS transistor) wired to function as a clamp diode to create a relatively fixed voltage drop between Vss 50 and VSSM 82b; however, Q1 could be an NMOS/PMOS diode or another voltage drop element. Q2 is gate driven by an inverted source retention signal SRETB 80a from the mode controller 80 to control the Vss supply circuit 82 to be effectively shorted (a very low voltage drop) (e.g., about 0.0 v) or to conduct and provide one diode voltage drop (e.g., about $V_{DIODE}$), for example. For example, when about 0.0 volts is applied at SRETB 80a, Q2 is turned off such that one diode drop $V_{DIODE}$ will be observed at VSSM, and when about Vdd is applied at SRETB 80a, Q2 conducts so that about 0.0 volts will be observed at VSSM. Although the supply circuits illustrated provide about one diode voltage drop $V_{DIODE}$, another such voltage drop is also anticipated in the context of the present invention.

Similarly, FIG. 1G illustrates a PMOS Vss supply circuit 82 driven by an NMOS transistor Q2 that is gate driven by an inverted retention signal SRETB 80a from the mode controller 80 to control the Vss supply circuit 82 to be effectively shorted (e.g., about 0.0 v) or to conduct and provide one diode voltage drop (e.g., about $V_{DIODE}$), for example. For example, when about Vdd is applied at SRETB 80*a*, Q2 is turned off such that one diode drop $V_{DIODE}$ will be observed at VSSM, and when about 0.0 volts is applied at SRETB 80*a*, Q2 conducts so that about 0.0 volts will be observed at VSSM.

Figure 1H:
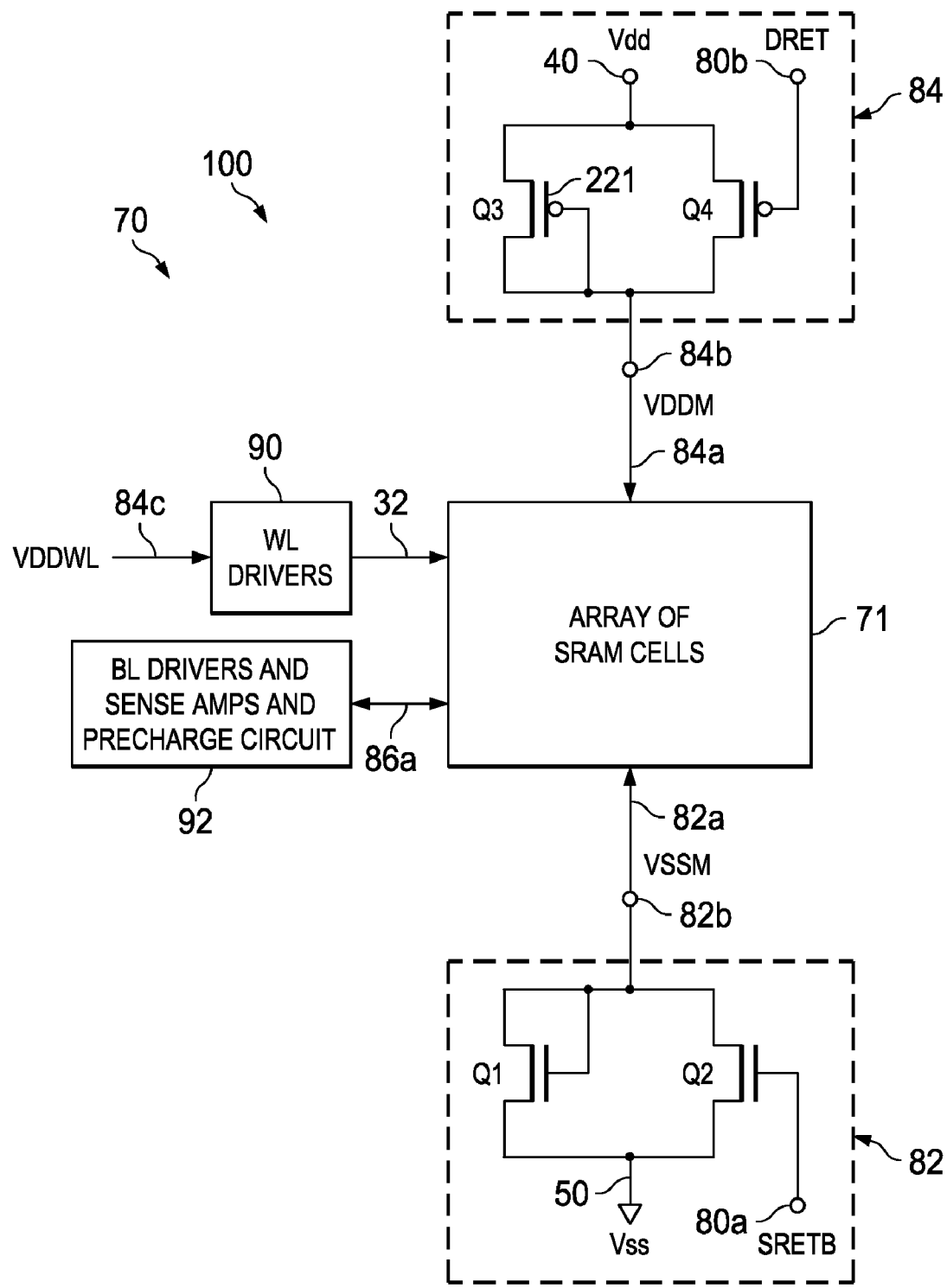
FIG. 1H is a block diagram of the memory and exemplary Vss and Vdd supply circuits of FIG. 1D-1G.

FIG. 1H illustrates an exemplary memory circuit 100 comprising the memory 70, and the Vss supply circuit 82 of FIG. 1D-1G, and an exemplary Vdd supply circuit 84, such as may be used in accordance with another aspect of the present invention. As previously discussed, NMOS Vss supply circuit 82 alters the Vss supply voltage 50 to a VSSM voltage applied to the array of SRAM cells 71 at the VSSM terminal 82*a*, while the PMOS Vdd supply circuit 84 alters the Vdd supply voltage 40 to a VDDM voltage applied to the array of SRAM cells 71 at the VDDM terminal 84*a*. For example, Vss supply circuit 82 raises VSSM above Vss 50 by about one diode voltage drop $V_{DIODE}$, while Vdd supply circuit 84 decreases VDDM below Vdd 40 by about one diode voltage drop. Again, either an NMOS or a PMOS supply circuit may be used for either the Vss or Vdd supply circuits.

Figure 2A:
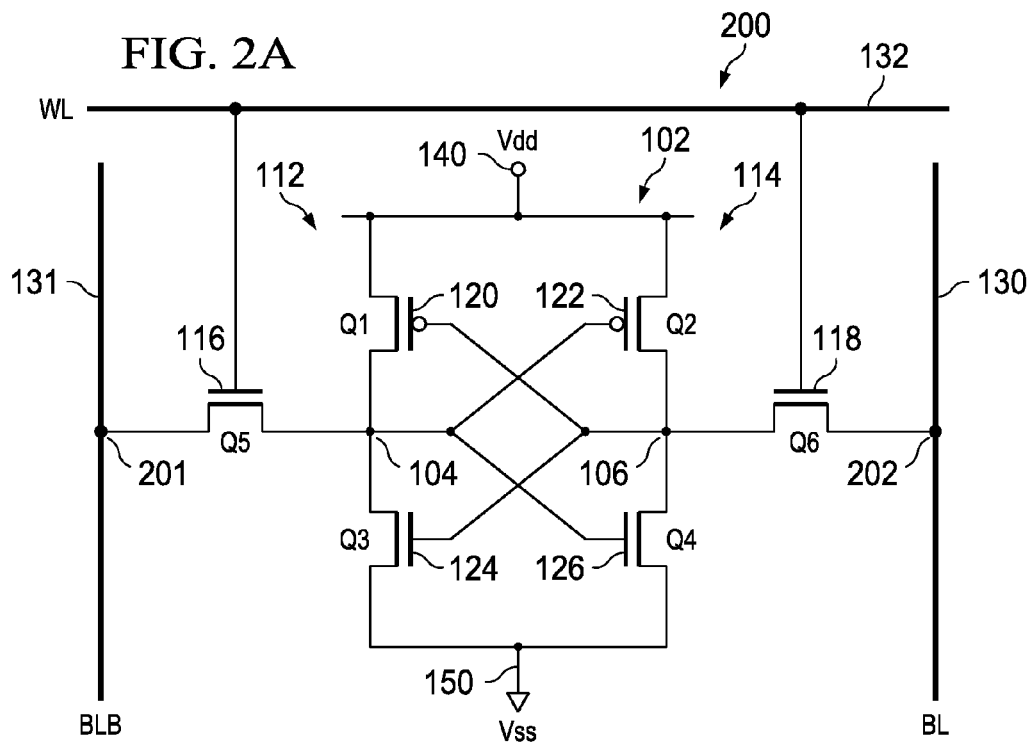
FIG. 2A is a is a schematic diagram of a conventional 6T static random access memory (SRAM) cell and SRAM core cell having a pair of output data nodes, such as may be used in accordance with one or more aspects of the present invention.

FIG. 2A illustrates an exemplary six-transistor (6T) SRAM cell 200 comprising a core cell 102, the 6T SRAM cell 200 being similar to that of the conventional 6T SRAM cell 1 of FIG. 1A, according to one or more aspects of the present invention. Many such 6T cells 200 may be used in a larger SRAM array, such as array 210 of FIG. 2B that will be discussed further infra.

The exemplary six-transistor (6T) SRAM cell 200 of FIG. 2A comprises two bitlines (e.g., bitline BL 130, and bitline bar BLB 131) and a wordline (e.g., word line WL 132). This conventional embodiment of SRAM cell core 102 comprises two cross-coupled inverters 112 and 114, wherein inverter 112 comprises a PMOS load transistor Q1 120 and an NMOS driver transistor Q3 124, and inverter 114 comprises a PMOS load transistor Q2 122 and an NMOS driver transistor Q4 126. Inverter 112 is coupled to bitline bar BLB 131 via NMOS passgate transistor Q5 116, while inverter 114 is coupled to bitline bar BL 130 via NMOS passgate transistor Q6 118. The gates of passgate transistors Q5 116 and Q6 118 are directly driven by the wordline WL 132. Core cell 102 is electrically powered by a drain supply Vdd 140 and a source supply Vss 150 (e.g., at ground potential). More generally, in a larger array of 6T SRAM cells 200, such as array 210 of FIG. 2B, Vss voltage 150 and Vdd voltage 140 (e.g., used in the periphery) may be supplied via upper metal layers of the array serving as power supply busses.

FIG. 2A may also be described and represented in another manner, wherein the six-transistor (6T) SRAM cell 200 comprises an SRAM cell core 102, and circuitry for writing to and reading from the SRAM cell core, according to the principles of the present invention. SRAM cell core 102 is a conventional design using two inverters. A first inverter 112 comprises a first driver transistor 124 and a first load transistor 120. A second inverter 114 comprises a second driver transistor 126 and a second load transistor 122. In this conventional embodiment of SRAM cell core 102, the driver transistors 124 and 126 are n-channel MOSFETs, and the load transistors 120 and 122 are p-channel MOSFETs.

The first inverter 112 has a first output 104 formed by a connection between the drain of the first load transistor 120 and the drain of the first driver transistor 124, and a first input 106 formed by a connection between the gate of the first driver transistor 124 and the gate of the first load transistor 120. Similarly, the second inverter 114 has a second output 106 formed by a connection between the drain of the second load transistor 122 and the drain of the second driver transistor 126, and a second input (or the first output) 104 formed by a connection between the gate of the second load transistor 122 and the gate of the second driver transistor 126. In a conventional manner, the first and second inverters 112, 114 are cross-coupled, meaning that the output of each inverter is connected to the input of the other, to form an SRAM cell core that stores a single bit of information. Read and Write operations occur conventionally in 6T cell 200 as with cell 1 of FIG. 1A.

For example, in a conventional manner, a write transistor 118 is connected to the first output 104. Similarly, a complementary write transistor 116 is connected to the second output 106. The gates of write transistor 118 and complementary write transistor 116 are each connected to a write wordline (WL) 132. Together, the write transistor 118 and the complementary write transistor 116 form a write circuit that is used to impose a state on the SRAM cell 200 in cooperation with the WL 132, a bit-line (BL) 130 and a complementary bit-line (BLB) 131. For example, if the BL 130 is set to a value of Vdd 140 while the BLB 131 is set to value of Vss 150, then, when the WL 132 is asserted (set to Vdd), the output of the first inverter 112 will be set to a value of Vdd plus the drain-source voltage of load transistor 120, while the output of the second inverter 114 will be set to Vss plus the drain-source voltage of driver transistor 126. This state may be interpreted as a logical "one" for the SRAM cell core 102. It is immediately apparent that repeating this operation with the BL 130 set to Vss and the BLB 131 set to Vdd would result in setting the SRAM core cell 102 to a logical "zero."

When the SRAM cell core 102 is storing a logical zero, the output of the second inverter 114 is high at node 106. The state of the SRAM cell 200 may be determined by precharging the state of the BL 130 to approximately Vdd and asserting the WL 132. However, if the SRAM cell 200 is set to a logical one, then the output of the second inverter is a logical zero.

Those skilled in the art of SRAM cell design will appreciate that the electrical characteristics of the inverter transistors and write transistors are balanced to optimize the stability of the SRAM cell 200. As both read and write functions are provided by the write transistor 118 and the complementary write transistor 116, the time required for a read operation is constrained by the maximum drive current (IDsat), and turn-on time of the write transistor 118 and the complementary write transistor 116. In addition, WRITE operation functionality is conventionally lost during the retention mode in order to provide a low quiescent current in the SRAM memory device. However, the present invention advantageously allows WRITE operation during the low power WRITE mode while significantly retaining a low IDDQ, and is substantially independent of the constraints on SRAM cell stability using the voltage bias and methods described infra.

Figure 2B:
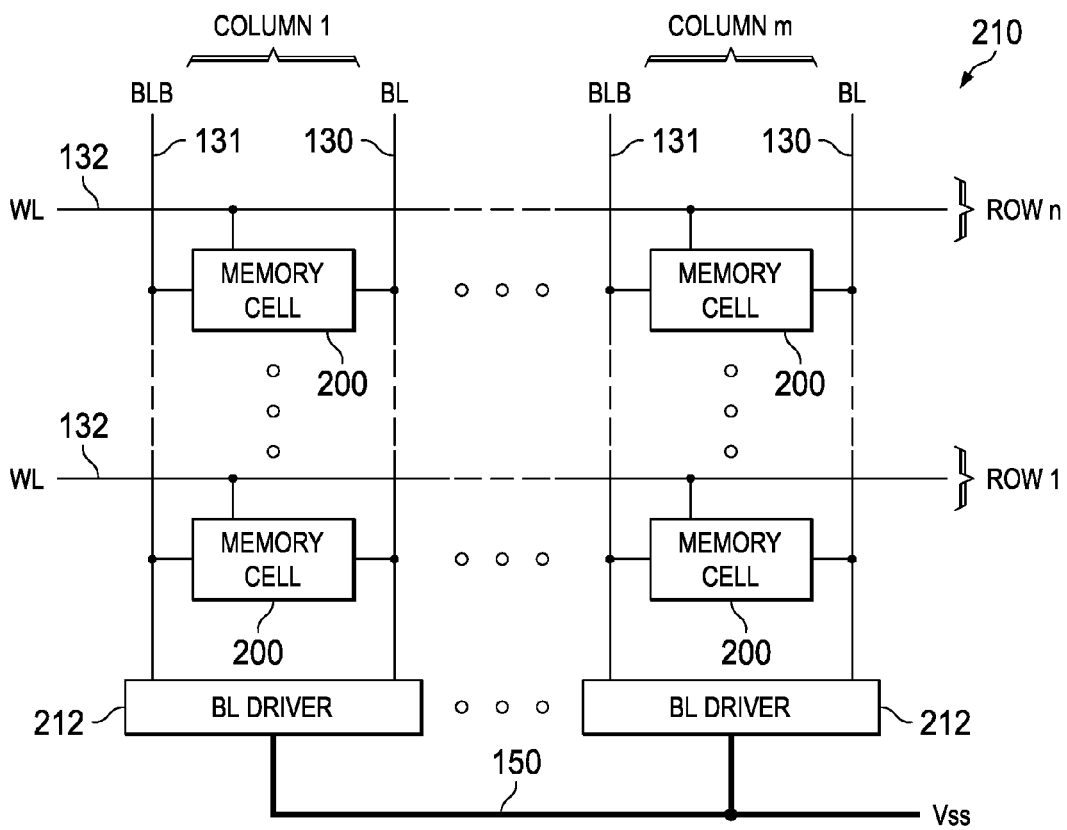
FIG. 2B is a schematic diagram of an exemplary array of memory cells, similar to the SRAM memory cell of FIG. 2A, the array having columns of bitlines and rows of wordlines according to one or more aspects of the present invention.

FIG. 2B illustrates an exemplary array 210 of SRAM memory cells 200, similar to the SRAM memory cell 200 of FIG. 2A according to one or more aspects of the present invention. The memory cells 200 of array 210 are arranged in rows (e.g., Row 1, . . . Row n) and columns (e.g., Column 1, . . . Column m) of cells 200. In addition, array 210 has columns (e.g., Column 1, . . . Column m) of bitlines, for example, BL 130, and BLB 131, and rows of wordlines (e.g., Row 1, . . . Row n), for example, WL 132. The bitlines BL 130 and BLB 131, are driven with complimentary states by a bitline driver 212 during memory write operations.

Figure 2C:
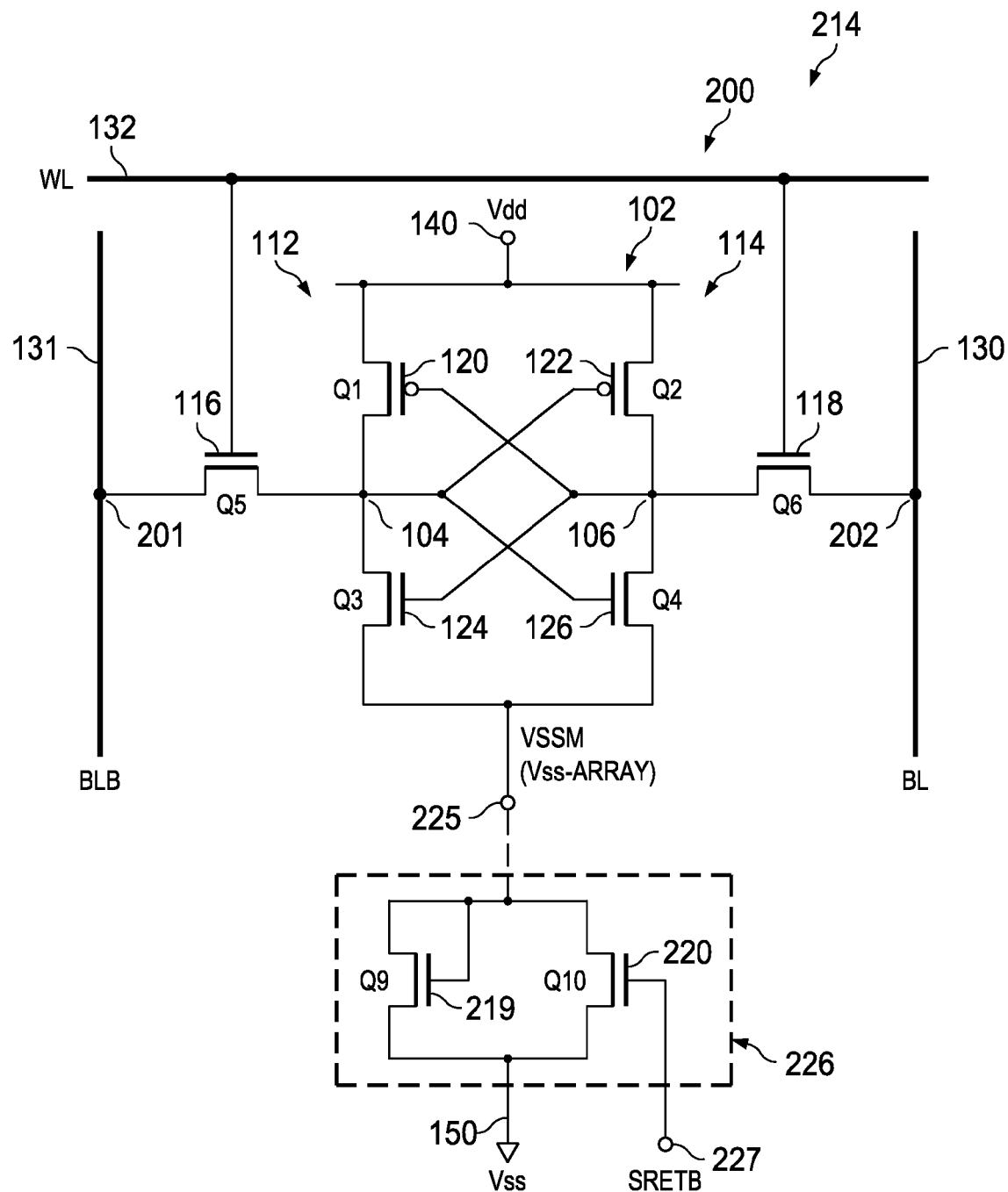
FIG. 2C is a schematic diagram of a 6T SRAM cell similar to that of FIG. 2A, further comprising a Vss supply circuit having a Vss clamp diode connected between a source terminal of the core cell and a source voltage (Vss), whereby the array Vss is raised relative to the substrate Vss to raise the threshold voltage of the transistors which reduces the IDDQ and improves the static noise margin of the cell during low power write mode, retention mode, and low power (slow) READ mode operations according to one or more aspects of the present invention.

FIG. 2C illustrates an exemplary cell circuit 214 having a 6T SRAM cell 200 similar to that of FIG. 2A according to one or more aspects of the present invention. Cell circuit 214 is similar to the 6T SRAM cell 200 of FIG. 2A, wherein cell 200 need not be completely described again for the sake of brevity. 6T SRAM cell 200 again comprises a latch 102, and further adds a Vss supply circuit 226 comprising a transistor Q9 219 connected as a clamp diode between an array source terminal (e.g., Vss-Array voltage VSSM 225) of the core or data cell 102 and a source voltage Vss 150. The Vss supply circuit 226 further comprises an NMOS driver transistor Q10 220 that is gated by a retention control signal SRETB 227. Vss supply circuit 226 is similar to that of the Vss supply circuit 82 of FIGS. 1D, 1F and 1H. The Vss supply circuit 226 may be shared among many such 6T cells 200 in an SRAM array, such as is shown in array 230 of FIG. 2D that will be discussed further infra. More generally, a voltage VSSM 225 is supplied to the array, where VSSM is >Vss of the periphery. In this embodiment of the present invention, the array-Vss 225 may be raised above Vss 150 by the voltage drop across Q9 219 (e.g., one diode voltage drop $V_{DIODE}$) during a low power WRITE mode and enabled by a word line voltage 132 to avoid upset of the cells in unaddressed columns of cells.

Figure 2D:
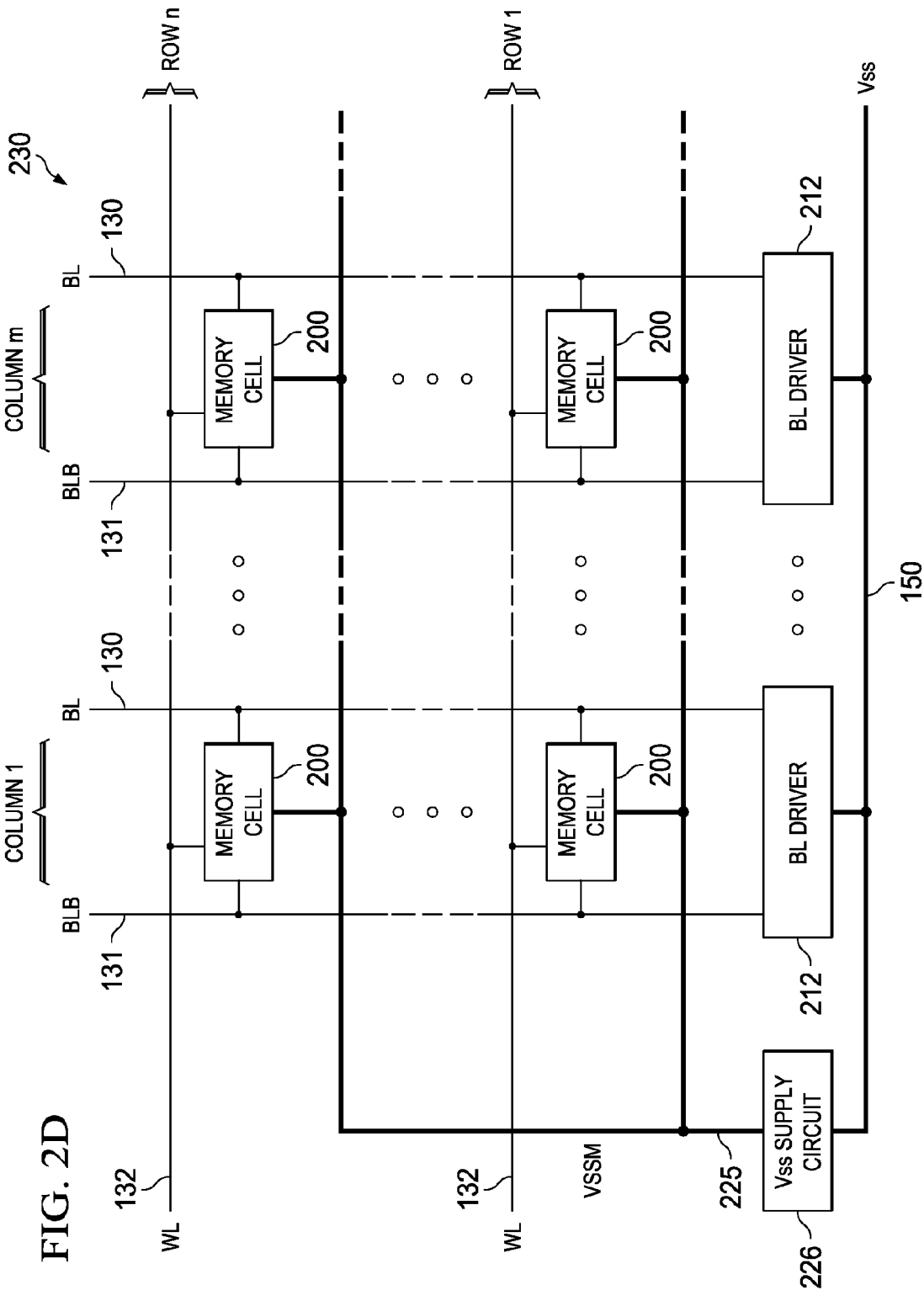
FIG. 2D is a schematic diagram of an exemplary array of memory cells, similar to the SRAM memory cell of FIG. 2C, the array having columns of bitlines, rows of wordlines, and a Vss supply circuit similar to that of FIG. 2B, according to one or more aspects of the present invention.
Figure 2E:
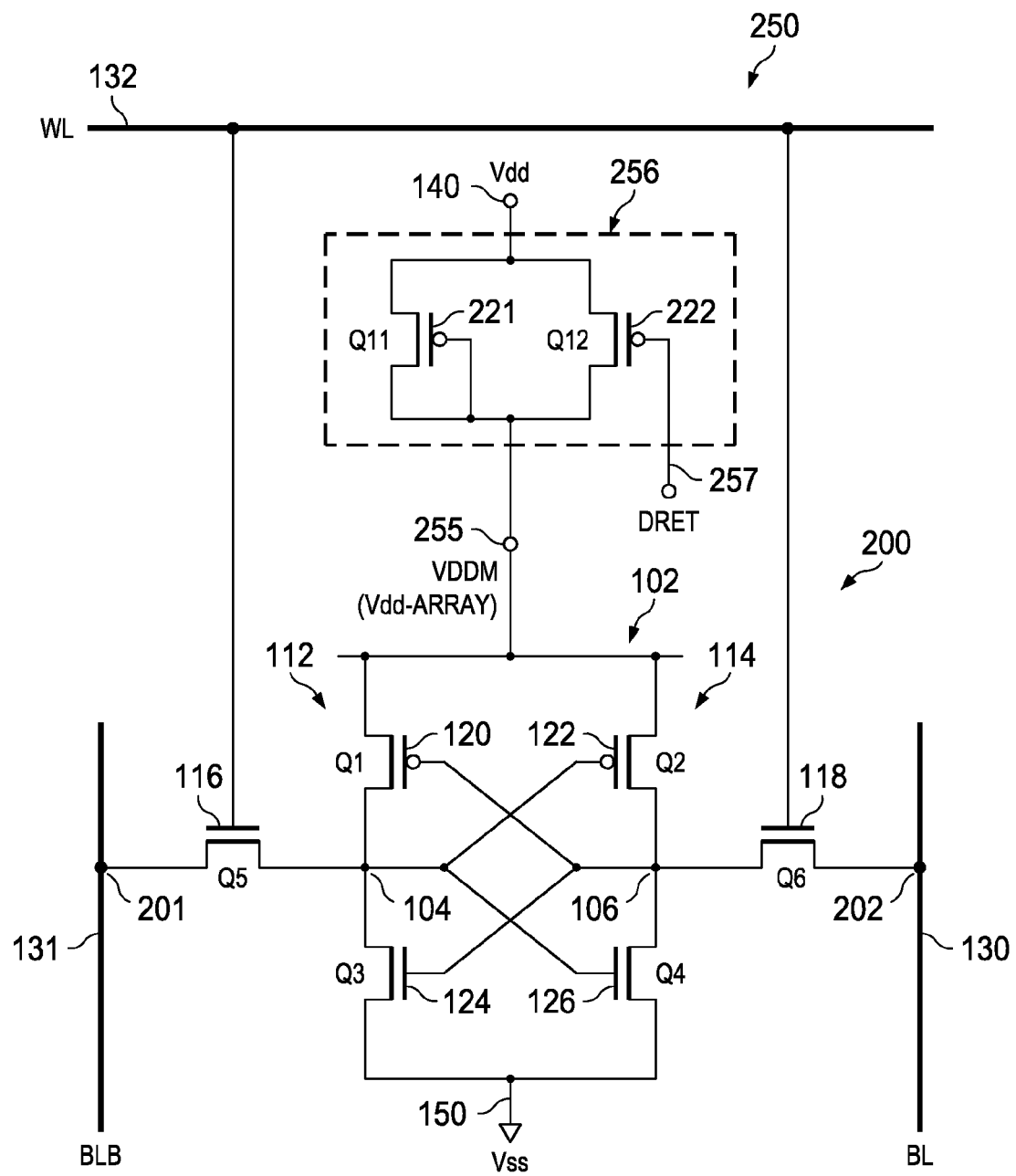
FIG. 2E is a schematic diagram of a 6T SRAM cell similar to that of FIG. 2A, further comprising a Vdd supply circuit having a Vdd clamp diode connected between a drain terminal of the core cell and a drain voltage (Vdd), whereby the array Vdd is reduced relative to Vdd to reduce the IDDQ, optionally in the retention mode or in the low power write mode according to another aspect of the present invention.

FIG. 2D illustrates an exemplary array 230 of SRAM memory cells 200, similar to the SRAM memory cell 200 and cell circuit 214 of FIG. 2B according to one or more aspects of the present invention. The array 230 of FIG. 2E is similar to the array 210 of FIG. 2B, and as such need not be described again fully for the sake of brevity. The memory cells 200 of array 230 are arranged in rows (e.g., Row 1, . . . Row n) and columns (e.g., Column 1, . . . Column m) of cells 200. In addition, array 230 has columns (e.g., Column 1, . . . Column m) of bitlines, for example, BL 130, BLB 131, and rows of wordlines (e.g., Row 1, . . . Row n), for example, WL 132. The bitlines BL 130 and BLB 131, are driven with complimentary states by a bitline drivers 212 during memory write operations.

Array 230 further comprises a Vss supply circuit 226, such as the clamp diode Q9 219 of FIG. 2C, for example. When a single Vss supply circuit 226 is utilized for the entire array, the VSSM 225 connection from each of the cells 200 may be connected to a single or common Vss supply circuit 226. Alternately, a Vss supply circuit may be provided for each column or for each row. Alternately, and as discussed previously, it will be appreciated in the context of the present invention, that a Vss supply circuit 226 or transistor Q9 219 may be included within each memory cell. For example, FIG. 2D illustrates an exemplary circuit when one Vss supply circuit 226 is used for the whole array, however, if the Vss supply circuit 226 is included within each 6T cell to form an 8T cell, for example, then the Vss supply circuit 226 of FIG. 2D would not be needed, and the line labeled VSSM 225 in the schematic would directly connect to Vss 150.

The circuit of array 230 provides conditions where VSS-array (VSSM 225) is >Vss as the write BL driver 212 provides a voltage closer to Vss than that of the Vss supply circuit 216, and wherein Vss is applied to the write BL driver circuitry 212 driving the bitlines BL 130 and BLB 131. Thus, in the embodiment of the present invention, the array-Vss 225 may be raised to provide a low power WRITE mode that saves power while avoiding upset of cells in unaddressed columns.

FIG. 2E illustrates a cell circuit 250 having a 6T SRAM cell 200 similar to that of FIG. 2A, further comprising a Vdd supply circuit 256. The Vdd supply circuit 256 comprises a PMOS Vdd clamp diode Q11 221 connected between a Vdd-array terminal 255 of the core cell and a drain voltage (Vdd 140). The Vdd supply circuit 256 further comprises an NMOS driver transistor Q12 222 that is gated by a retention control signal DRET 257. Vdd supply circuit 256 is similar to that of the Vdd supply circuit 84 of FIGS. 1D and 1H. Using the Vdd supply circuit 256, the array Vdd VDDM 255 is reduced relative to Vdd 140, which reduces the IDDQ during low power write mode operations according to another aspect of the present invention. The Vdd supply circuit 256 may be shared among many such 6T cells 200 in an SRAM array, similar to that of memory circuit 100 of FIG. 1H. The VDD supply circuit 256 may also be shared with the WL driver circuit such that the WL high voltage is lowered or raised along with VDDM. Similarly, VDDM may be shared with the BL precharge circuit. Although it may be preferable to first utilize the Vss supply circuit 226 as shown in FIGS. 2C and 2D, and then to add the Vdd supply circuit 256 of FIG. 2E, alternately, either circuit may be used alone or in combination as shown in FIGS. 1H and 2F, according to one or more embodiments of the present invention.

Figure 2F:
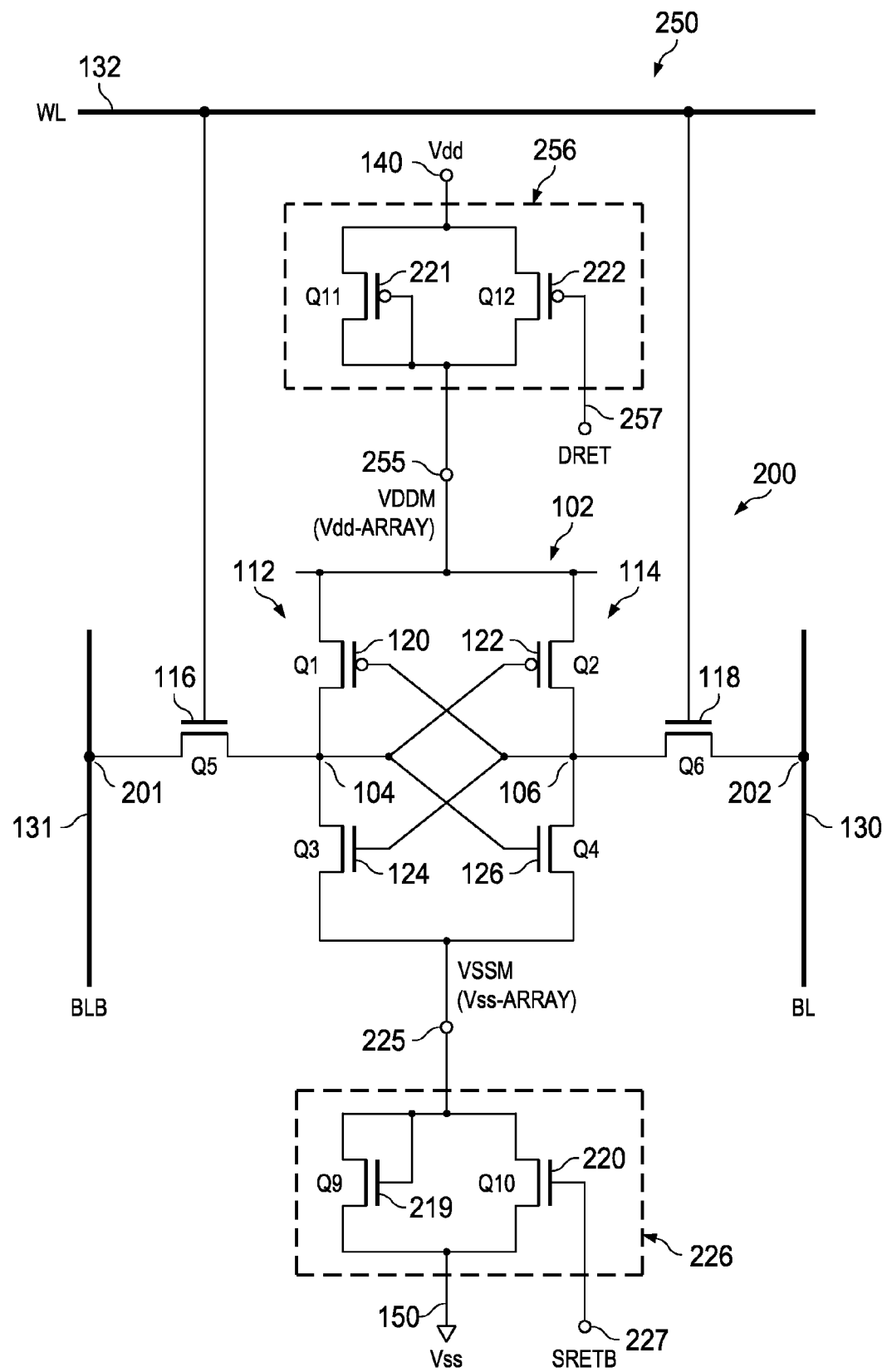
FIG. 2F is a schematic diagram of a 6T SRAM cell similar to that of FIG. 2A, further comprising Vdd and Vss supply circuits, whereby the array Vdd may be reduced relative to Vdd and the array Vss may be raised relative to Vss, which reduces the IDDQ of the cell during very low power retention and low power write mode operations according to one or more aspects of the present invention.

FIG. 2F illustrates one embodiment of a memory circuit 260, having a 6T SRAM cell 200 similar to that of FIG. 2A, and further comprising Vss and Vdd supply circuits 226, 256, whereby the array Vss voltage VSSM 225 may be raised relative to Vss 150 and the array Vdd voltage VSSD 255 may be reduced relative to Vdd 140 according to one or more aspects of the present invention. The Vss supply circuit 226 and Vdd supply circuit 256 are similar to those of FIGS. 2C and 2E, respective, and as such need not be described again for the sake of brevity. Such array supply voltage adjustments may be made to minimize power consumption while avoiding an upset of cells in unaddressed columns of the addressed row, yet still enabling some operational functionality such as a low power or very low power WRITE, low power slow READ, or very low power retention modes, for example, as will be discussed further in association with FIG. 6B. These supply voltage adjustments raise the threshold voltage of the transistors, which reduces the IDDQ and improves the static noise margin of the cell during the selected low power modes of operation.

Those familiar with the art of memory design will realize there are other methods of altering the array supply voltages, such as using diodes, zeners, voltage regulators, resistors, variable resistors, or combinations thereof including other voltage drop elements between the supply and the array, or by using other external voltage supplies, for example.

FIGS. 3A and 3B illustrate simplified timing diagram plots 300 and 330, respectively, of the two conventional modes of operation, the modes including a retention mode 304, and a full active mode 306 comprising an active READ mode 306a and an active WRITE mode 306b of operation, such as may be used in association with prior art memory circuits. Plots 300 and 330 illustrate the relationship of the supply voltages VSSM 320 and VDDM 310, respectively, applied to a prior art memory array voltages plotted vs. time t within and between the possible modes of operation. Prior art memory circuits (e.g., FIGS. 1A and 1B) typically use an array drain voltage VDDM 310 at about the full Vdd voltage and an array source voltage VSSM 320 at about the full Vss voltage (e.g., about 0.0 v), as is shown in FIGS. 3A and 3B during the active READ 306a and the active WRITE 306b.

During retention 304, one prior art memory operation illustrated in FIGS. 3A and 3B, utilizes a full array drain voltage VDDM 310, wherein the array voltage VDDM is about the drain voltage Vdd, and a raised array source voltage VSSM 320, wherein VSSM 320 is raised to about one diode voltage drop ($V_{DIODE}$) relative to Vss (about 0.0 v) to reduce quiescent leakage current IDDQ in the memory array. Although this retention mode 304 saves power, at a minimum retention voltage, the cells of the array cannot be accessed for a READ or WRITE operation in a normal manner. As has been discussed, this is because the static noise margin SNM and the read current (Iread) of the cell are all reduced during this bias situation. Further, a reduced SNM can lead to cell upsets during READ or to unaddressed columns of cells in an accessed row during a WRITE. Therefore, there is overhead in latency and power for going into and out of the retention mode 304. Thus, another memory and method is needed that has a reduced IDDQ mode that still allows some READ or WRITE operation functionality.

In response, and in addition to the prior art memory circuits and operational modes illustrated in FIGS. 3A and 3B, the memory circuits and methods of the present invention utilize the additional modes illustrated in timing diagrams of FIGS. 4A-4F, the flow chart of FIG. 5, and the mode vs. voltage charts of FIGS. 6A and 6B described and illustrated hereinafter.

FIGS. 4A and 4B, for example, illustrate timing diagram plots 400 and 430, respectively, of several modes of operation that may be selected by the mode control circuitry 72 of FIG. 1D using the read and write inputs in accordance with one or more aspects of the present invention. The modes which may be selected and which are illustrated include the retention mode 304, the full active mode 306, again comprising the active read mode 306a or the active WRITE mode 306b (where a READ or WRITE can be performed in Full Active), and a low power write mode 406b of operation, such as may be used in the memory circuits and methods of the present invention. Plots 400 and 430 illustrate the relationship of the supply voltages VSSD 410 and VDDM 420, respectively, applied to the memory array, the voltages plotted vs. time t within and between the possible modes of operation.

During the retention mode 304, as illustrated in FIGS. 4A and 4B, the memory circuits of the present invention (e.g., FIGS. 1D and 2F) are operable to select an array drain voltage VDDM 410 at about the full Vdd voltage and an array source voltage VSSM 420 that is raised to about one diode voltage drop ($V_{DIODE}$) relative to Vss (about 0.0 v) to reduce IDDQ in the memory array.

During the full active mode 306, comprising the active read mode 306a or the active WRITE mode 306b, the memory circuits of the present invention are operable to select an array drain voltage VDDM 410 at about the full Vdd voltage and an array source voltage VSSM 420 at about 0.0 v, thereby achieving the same supply voltages as the prior art for the full active mode.

During a new low power WRITE mode 406b, as illustrated in FIGS. 4A and 4B, the memory circuits of the present invention (e.g., FIGS. 1D and 2F) are operable to select an array drain voltage VDDM 410 at about the full Vdd voltage and an array source voltage VSSM 420 that is raised (e.g., floats up) to about one diode voltage drop ($V_{DIODE}$) relative to Vss (about 0.0 v) to reduce IDDQ in the memory array during the low power WRITE mode 406b. VSSM 420 may be driven to the higher voltage in transition from the full active mode to the retention mode or to the low power write mode; however, less dynamic power will be used if VSSM 420 is allowed to float up the higher voltage level. A fast transition from the lower value of VSSM to the higher value of VSSM is not needed since WRITE can occur over the range of VSSM. Plot 400 illustrates the conditions during a mode transition from the FULL ACTIVE mode 306 to the low power WRITE mode 406b, while plot 430 illustrates mode transitioning from the low power WRITE mode 406b to the FULL ACTIVE mode 306. In the later situation of plot 430, the transition occurs more quickly as VSSM 420 is driven to Vss, while in plot 400, VSSM 420 only floats up slowly to $V_{DIODE}$ without a driver, for example. Other drive methods, however, may be applied if desired to speed the transition.

Figure 4C:
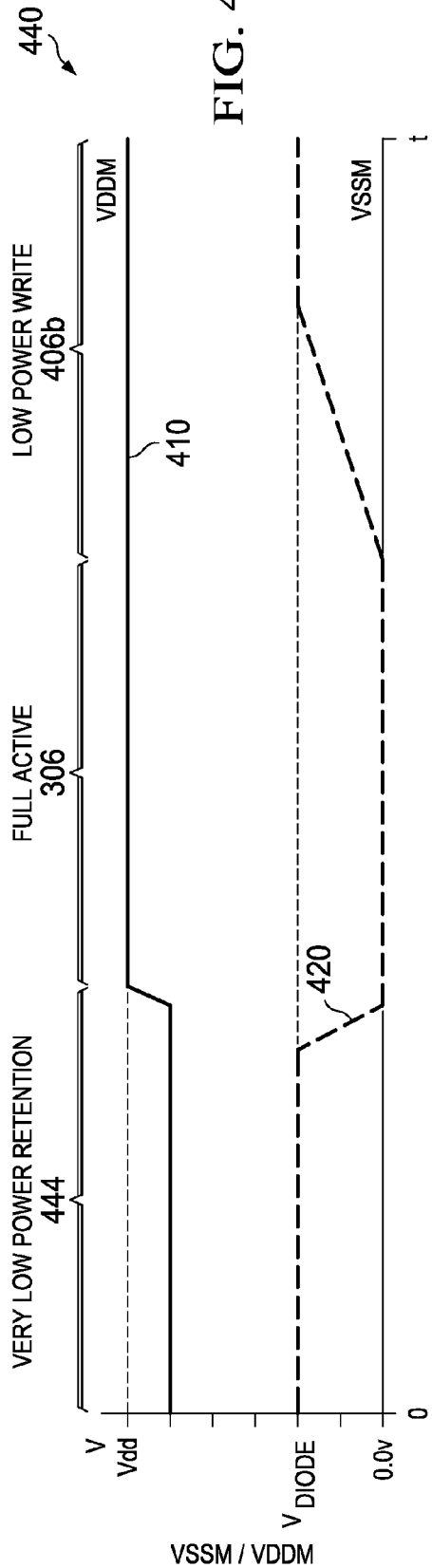
FIGS. 4C and 4D are simplified timing diagrams of other modes of operation that may be selected by the mode control circuitry of FIG. 1D using the read and write inputs, the modes illustrated including a very low power retention mode, the active read mode, and the low power write mode of operation according to one or more aspects of the present invention.
Figure 4D:
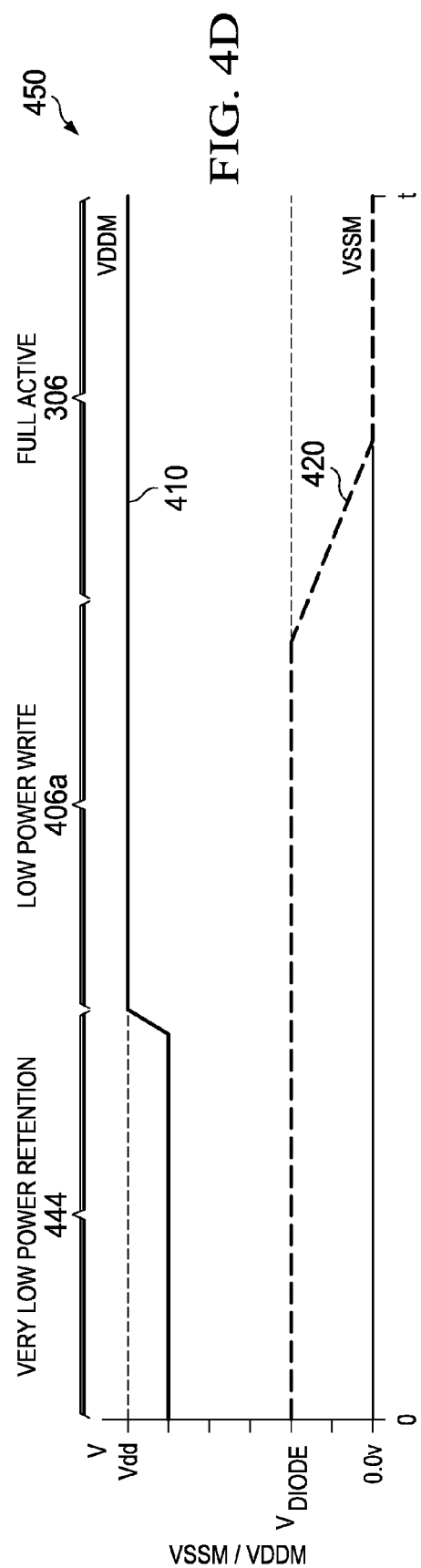

FIGS. 4C and 4D illustrate timing diagram plots 440 and 450, respectively, of several additional modes of operation that may be selected by the mode control circuitry 72 of FIG. 1D using the read and write inputs in accordance with the present invention. The modes which may be selected and which are illustrated include a very low power retention mode 444, the active read mode 306a, and the low power write mode 406b of operation, such as may be used in the memory circuits and methods of the present invention. Plots 440 and 450 illustrate the relationship of the supply voltages VSSM 420 and VDDM 410, respectively, applied to the memory array, the voltages plotted vs. time t within and between the possible modes of operation.

During the new very low power retention mode 444, as illustrated in FIGS. 4C and 4D, the memory circuits of the present invention (e.g., FIGS. 1D and 2F) are operable to select a reduced array drain voltage VDDM 410 at about one threshold voltage less than the Vdd drain voltage (Vdd-Vtn) and an array source voltage VSSM 420 that is raised (e.g., floats up) to about one diode voltage drop ($V_{DIODE}$) relative to Vss (about 0.0 v) to reduce IDDQ in the memory array during the very low power retention mode 444. Plot 440 illustrates the conditions during a mode transition from the very low power retention mode 444 to the FULL ACTIVE mode 306, while plot 450 illustrates mode transitioning from the very low power retention mode 444 to the low power WRITE mode 406b.

Plot 440 also illustrates the conditions during a mode transition from the FULL ACTIVE mode 306 to the low power WRITE mode 406b, while plot 450 illustrates mode transitioning from the low power WRITE mode 406b to the FULL ACTIVE mode 306. Again, in the later situation of plot 450, the transition occurs more quickly as VSSM 420 is driven to Vss, while in plot 440, VSSM 420 only floats up slowly to $V_{DIODE}$ without a driver, for example. Optionally, the transition of VSSM 420 for a READ operation can be slower, but this variation introduces latency. To reduce the latency, READ can be started before VSSM is at the lower value.

FIGS. 4E and 4F illustrate timing diagram plots 460 and 470, respectively, of several further modes of operation that may be selected by the mode control circuitry 72 of FIG. 1D using the read and write inputs in accordance with the present invention. The modes which may be selected and which are illustrated include the retention mode 304, a low power or slow READ mode 406a, the low power write mode 406b, the very low power retention mode 444, a very low power write mode, and the active read mode 306a of operation, such as may be used in the memory circuits and methods of the present invention. Plots 460 and 470 illustrate the relationship of the supply voltages VSSM 420 and VDDM 410, respectively, applied to the memory array, the voltages plotted vs. time t within and between the possible modes of operation. The retention mode 304, the low power WRITE mode 406b, the very low power retention mode 444, and the active read mode 306a operate as previously described in FIGS. 4A-4D, and as such need not be described again for the sake of brevity.

During the new low power or slow READ mode 406a, as illustrated in FIG. 4E, the memory circuits of the present invention (e.g., FIGS. 1D and 2F) are operable to select an array drain voltage VDDM 410 at about the full drain voltage (Vdd) and an array source voltage VSSM 420 that is raised (e.g., floats up) to about one diode voltage drop ($V_{DIODE}$) relative to Vss (about 0.0 v) to reduce IDDQ in the memory array during the slow READ mode 406a. Plot 460 illustrates the conditions during a mode transition from the retention mode 304 to the slow READ mode 406a, and mode transitioning from the slow READ mode 406a to the low power WRITE mode 406b. Not shown is the power to the peripheral circuits that may be powered down in the retention mode and powered up in the slow read mode, low power write mode, or full active mode.

During the new very low power WRITE mode 446b, as illustrated in FIG. 4F, the memory circuits of the present invention (e.g., FIGS. 1D and 2F) are operable to select a reduced array drain voltage VDDM 410 at about one threshold voltage less than the Vdd drain voltage (Vdd-Vtn) and an array source voltage VSSM 420 that is raised (e.g., floats up) to about one diode voltage drop ($V_{DIODE}$) relative to Vss (about 0.0 v) to reduce IDDQ in the memory array during the very low power WRITE 446b. It should be noted that the very low power WRITE mode 446b is generally applicable for memory WRITE operations on non-interleaved columns where all columns accessed by the selected word line are to be written and cell stability is not an issue. Cell stability can be improved by lowering the high (selected) word line voltage and/or by lower BL precharge voltage. With improved cell stability, the very low power write mode may also be implemented with interleaved columns, where not all columns accessed by the selected word line are to be written and stability is an issue for the columns not written.

Plot 470 illustrates the conditions during a mode transition from the very low power retention mode 444 to the very low power WRITE mode 446b, and mode transitioning from the very low power WRITE mode 446b to the FULL ACTIVE mode 306, for example. Optionally, the transition of VSSM 420 for a READ operation can be slower, but this variation introduces latency.

Plot 470 of FIG. 4F further illustrates another option, in accordance with the present invention, which is to reduce the WL high state voltage VWL 475 in the low power WRITE modes (e.g., the low power write 406b, or the very low power write 446b). As has been discussed, with the array-Vss (VSSM) raised and the bitline pulled lower than VSSM for WRITE, the WRITE is very robust, such that there is some margin for lowering the WL high state voltage VWL 475. This bias condition further reduces power and also improves the SNM of the unaddressed cells in the accessed row for the low power write 406b, or the very low power write 446b, for example. VWL 475 is an example waveform, which may be shown and used in association with any of the low power WRITE signals shown and discussed herein, for example.

Figure 4G:
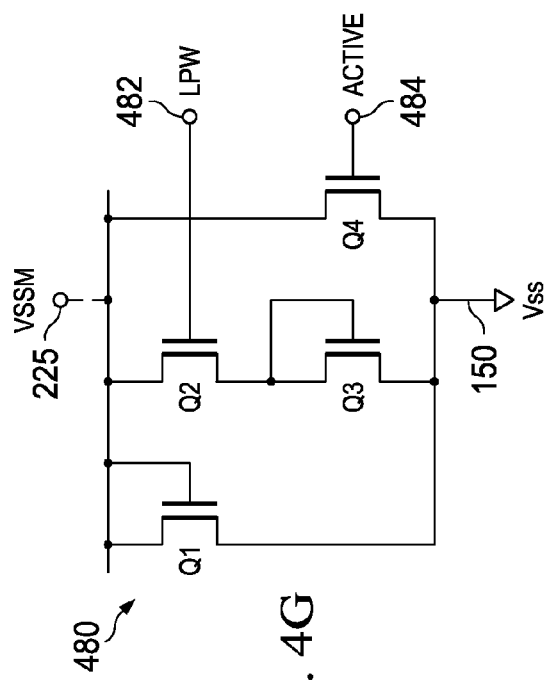
FIGS. 4G and 4H are an optional exemplary circuit and a simplified timing diagram, respectively, for supplying a different raised VSSM in RETENTION vs a VSSM in a low power WRITE mode, and illustrating yet another mode of operation that may be selected by the mode control circuitry of FIG. 1D according to another aspect of the present invention.
Figure 4H:
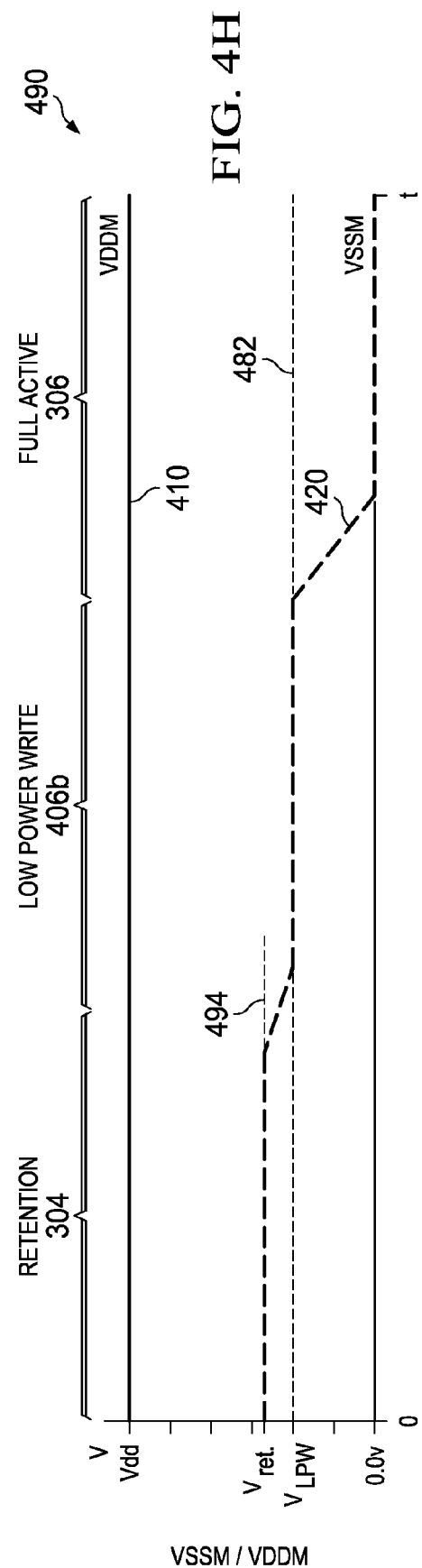

FIGS. 4G and 4H illustrate another exemplary circuit 480 and a simplified timing diagram 490, respectively, for supplying a different raised VSSM 420 raised to Vret 494 in RETENTION 304 vs. a VSSM 420 in a low power WRITE mode 406b, lowered to a $V_{LPW}$ 482 level of a low power write (LPW) mode. For example, the circuit 480 provides an input LPW 482, which is driven high for the full active mode 306, and an input Active 484, that is driven high for the LPW mode 406b. Optionally, VSSM is raised higher in retention than in the LPW mode. In a second option, the READ can be initiated during the transition of VSSM for the READ. This further illustrates additional modes of operation that may be selected by the mode control circuitry 80 of FIG. 1D according to another aspect of the present invention.

Figure 5:
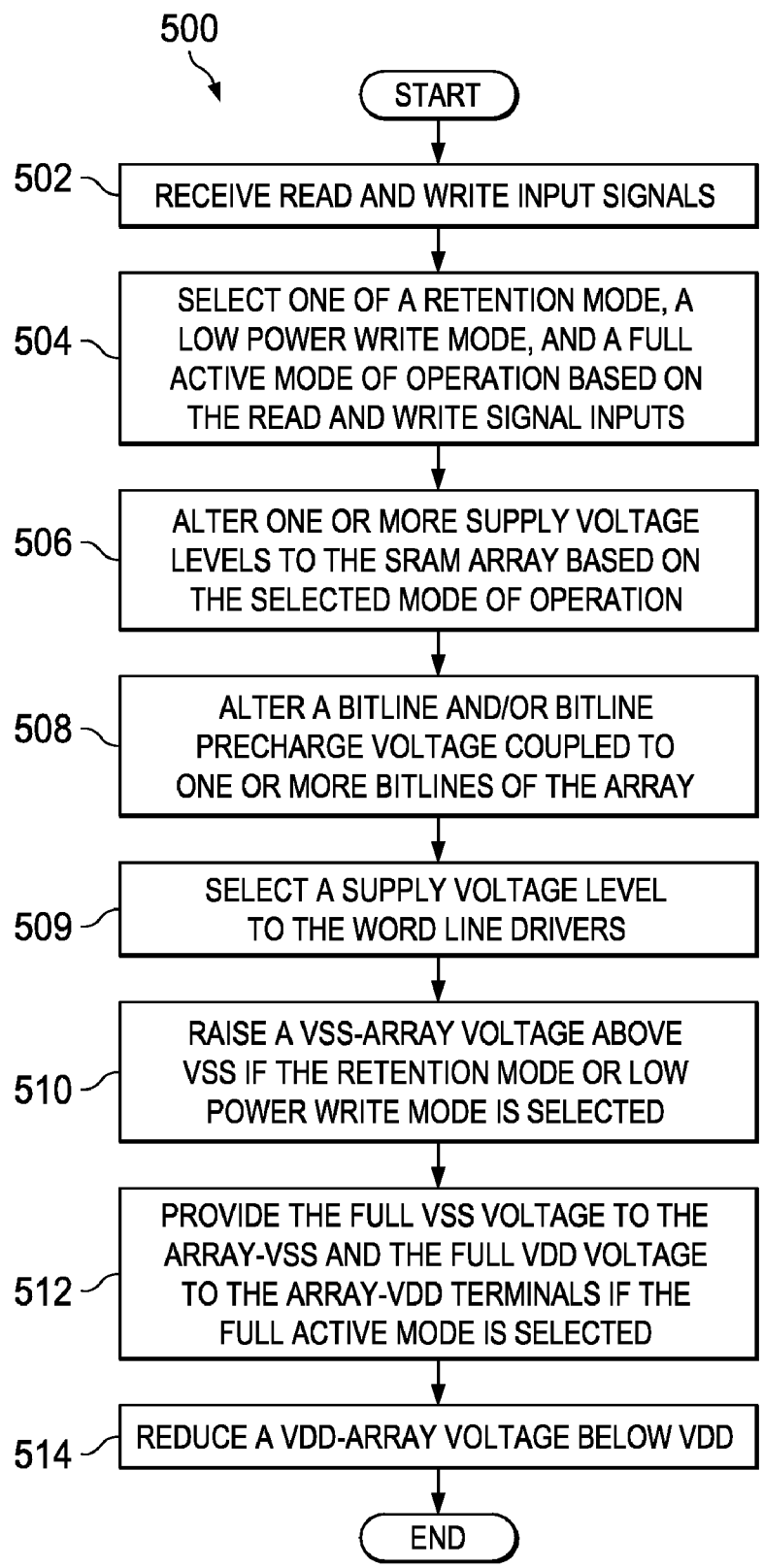
FIG. 5 is a flow diagram of the method of reading and writing in an embedded SRAM memory array having three or more modes of operation according to an aspect of the invention.

Referring now to FIG. 5, further aspects of the invention relate to methods of reading and writing in an embedded SRAM memory array (e.g., 62 of FIGS. 1C and 1D) having three or more modes of operation, wherein FIG. 5 illustrates an exemplary method 500 in accordance with the invention, and FIGS. 1D-1H and 2A-2F illustrate the exemplary memory and mode control circuitry in accordance with the present invention. While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Also, the retention mode is not required. Furthermore, the methods according to the present invention may be implemented in association with the fabrication of SRAMs, ICs and composite transistors illustrated and described herein, as well as in association with other transistors and structures not illustrated, including but not limited to NMOS and/or PMOS composite transistors formed in the core region and the logic region of an SRAM array.

The method 500 begins at 502, wherein read, write, and mode select input signals (e.g., 74, 76 of FIG. 1D) are received, for example, into the mode controller 80 of the mode control circuitry 72 within a memory (e.g., 62 of FIGS. 1C and 1D) embedded within an IC 60.

Optionally, at 504 a selection of one of a retention mode 304, a low power WRITE mode 406b, or a full active mode 306 comprising an FULL ACTIVE mode 306 and an active WRITE mode 306b is made (e.g., by a mode controller 80 and mode control circuitry of FIG. 1D) based on the read, write, and mode select signals (e.g., 74, 76 of FIG. 1D).

The level of one or more supply voltages (e.g., VSSM 82a, and VDDM 84a of FIG. 1D) coupled to the SRAM array is then altered based on the selected mode of operation at 506.

At 508, a bitline and or a bitline precharge voltage (e.g., 86a of FIG. 1D) coupled to one or more bitlines (e.g., 130 and 131 of FIGS. 2A-2F) of the array (e.g., 62 of FIGS. 1C and 1D) is altered based on the selected mode of operation.

At 509, the supply voltage to the WL drivers is selected.

At 510, an array-Vss voltage VSSM 82a is raised above Vss (e.g., Vss 50 of FIG. 1D) if the retention mode 304 or the low power write mode 406b is selected. Optionally, VSSM may be raised to a different level for the retention mode compared to the level for the low power write mode.

At 512, the full Vss voltage (e.g., Vss 50 of FIG. 1D) is provided to the array-Vss terminals VSSM 82b and the full Vdd voltage Vdd 40 is provided to the array-Vdd terminals VDDM 84b if the full active mode 306 is selected.

Finally, at 514, the array-Vdd voltage VDDM 84a may be reduced below Vdd 40.

FIGS. 6A and 6B are charts 600 and 650, respectively, of the modes of operation 602, exemplary voltage signals 620, operations enabled 616, and relative quiescent currents IDDQ 618 for the three or more modes of operation 602 that may be selected by the mode control circuitry (e.g., 72 of FIG. 1D) in accordance with the principles of the present invention and the timing diagrams of FIGS. 4A-4F.

FIG. 6A, for example, illustrates the modes available 602 and voltage bias conditions when a Vss supply circuit (e.g., 82 of FIG. 1D, or 226 of FIG. 2C) and the BL/BL precharge circuit (e.g., 86 of FIG. 1D) is altered by the mode controller (e.g., 80 of FIG. 1D). In particular, when various combinations of these supply circuits are altered or varied by the mode controller 80, an active READ 606, an active WRITE 608, a retention (RET) 610, a low power WRITE 612, and a low power (slow) READ 614 mode are available to the memory to permit power savings as well as some additional operational functionality. The combinations shown are exemplary. For example, VSSM in the retention or low power modes may be set to some raised voltage other than a diode voltage. Also VSSM may be set to a different voltage for retention than for low power write, or there may not be a separate retention mode at all.

FIG. 6B further illustrates the additional modes available 602 and voltage bias conditions when a Vss supply circuit (e.g., 82 of FIG. 1D, or 226 of FIGS. 2C and 2F), a Vdd supply circuit (e.g., 84 of FIG. 1D, or 256 of FIGS. 2E and 2F), and the BL/BL precharge circuit (e.g., 86 of FIG. 1D) are altered by the mode controller (e.g., 80 of FIG. 1D). In particular, when various combinations of these supply circuits are altered or varied by the mode controller 80, the active READ 606, the active WRITE 608, a very low power (VLP) retention (RET) 634, a very low power WRITE 636, and the low power WRITE 612 modes are available to the memory to permit additional power savings as well as some additional operational functionality.

For example, if the very low power retention or VLP RET mode 634 of FIG. 6B is selected by the mode controller 80, 0.0V is applied to signal SRETB 227 and Vdd is applied to the DRET 257 signal to control the Vss supply circuit 226 to provide a $V_{DIODE}$ voltage (above Vss 150) on VSSM 225 and control the Vdd supply circuit 256 to provide a Vdd-$V_{DIODE}$ voltage (below Vdd 140) on VDDM 255, respectively. In addition, VLP RET mode 634 is also enabled by providing 0.0V on wordline voltage VWL 132, and allowing bitline voltage VBL 130 to float. The VLP RET mode 634 thus provides a very low IDDQ level as indicated at 618 on chart 650.

In another example, if the low power WRITE mode 612 of FIGS. 6A and 6B is selected by the mode controller 80, 0.0V is applied to the SRETB 227 and DRET 257 signals to control the Vss supply circuit 226 to provide a $V_{DIODE}$ voltage (above Vss 150) on VSSM 225, and control the Vdd supply circuit 256 to provide a Vdd voltage 140 on VDDM 255, respectively. In addition, the low power WRITE mode 612 is also enabled by providing a transition from 0.0V to Vdd on wordline voltage VWL 132, and providing Vdd on bitline voltage VBL 130. The low power WRITE mode 612 thus provides a low IDDQ level during WRITE operations as indicated at 618 on chart 650.

The other modes indicated on charts 600 and 650 of FIGS. 6A and 6B are selected in a similar manner to that described above to provide various normal and low power modes of operation for reduced IDDQ and flexibility of operations in accordance with the systems, methods, and timings described herein.

In addition, the mode control circuitry 72, may further comprise a bitline precharge circuit (84) coupled to one or more bitlines of the array, the bitline precharge circuit configured to reduce a bitline precharge voltage below a Vdd supply voltage level in response to the selected mode. The bitline precharge circuit may comprise another voltage drop element or circuit similar to the Vdd supply circuit 256 of FIGS. 2E and 2F to create a voltage drop between the bitlines and the Vdd supply 140.

The circuits and systems that have described herein represent examples of implementations of the present invention, and other similar circuits and methods may occur to one skilled in the art, and as such are anticipated in the context of the present invention.

Although the Vss and Vdd supply circuits and/or the BL/BL precharge circuit of the present invention have been illustrated and described in the context of simple on/off circuits, alternatively, or in combination the Vss and Vdd supply circuits and/or the BL/BL precharge circuit of the present invention may comprise fully adjustable voltage drop circuit, wherein the voltage across each circuit is infinitely variable. Those skilled in the art of SRAM design will recognize that these design options may be combined as desired to meet the design constraints of the circuit.

Other such cell and transistor technology variations, including array orientation variations are anticipated in the context of the present invention. For example, the roles of PMOS and NMOS, and the associated roles of VSS and VDD may be reversed.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, wherein cell size and patterning considerations are problematic, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. An integrated circuit comprising an SRAM, an array-Vss voltage coupled to said SRAM that provides a same low supply voltage simultaneously to cells of every column of said SRAM, and an array-Vdd voltage coupled to said SRAM that provides a same high supply voltage simultaneously to said cells of every column of said SRAM; said SRAM having an active mode and a lower leakage mode—;—wherein read and write are enabled in the active mode and write is enabled in the lower leakage mode; further wherein the array-Vss voltage is Vss in the active mode and the array-Vss is raised one diode voltage drop above Vss in the lower leakage mode.

2. The integrated circuit of claim 1, wherein said SRAM comprises an array of SRAM cells, and wherein a first level of said array-VSS voltage applied to said array is raised in the lower leakage mode relative to a second level of said array-Vss voltage applied to said array in the active mode.

3. The integrated circuit of claim 1, wherein a slow read is enabled in said lower leakage mode.

4. The integrated circuit of claim 1, further comprising a retention mode wherein read and write are disabled in said retention mode.

5. A method of reducing power in an integrated circuit, said circuit comprising an SRAM array, said method comprising:
  enabling a write in a low power mode and in a full active mode;
  raising a Vss-array voltage to every cell of said SRAM array to a same voltage that is above a Vss supply voltage level in a retention mode and in said low power mode;

reducing a Vdd-array voltage to said every cell of said SRAM array to a same voltage that is below a Vdd supply voltage level in said retention mode and in said low power mode; and providing said Vss supply voltage to an array Vss terminal and said Vdd supply voltage to an array Vdd terminal in the full active mode.

6. The method of claim 5, wherein a low supply voltage applied to the SRAM array is raised in the low power mode relative to a low supply voltage applied to the array in the full active mode.

7. The method of claim 5, further comprising enabling a slow read in the low power mode.

8. The method of claim 5, further comprising disabling READ and WRITE operations in a retention mode.

9. The method of claim 5, further comprising transitioning between the low power mode and the full active mode, wherein there is no latency in the transition between the modes.

10. The method of claim 6, further comprising reducing the wordline voltage during the low power mode.

11. The method of claim 8, further comprising:
altering a bitline precharge voltage coupled to one or more bitlines of the array in response to one of the low power mode, the active mode, and the retention mode.

12. The method of claim 11, wherein the altering of the bitline precharge voltage comprises precharging the one or more bitlines to a lower voltage in the low power mode than in the full active mode.

13. The method of claim 5, further comprising:
driving a bitline coupled to one or more bitlines of the array to a bitline voltage that is below a Vss-array voltage in the low power mode.

14. The method of claim 5 wherein said SRAM is an embedded SRAM.

15. The method of claim 5 wherein said low power mode has a lower power than said full active mode.

* * * * *